US009939476B2

(12) United States Patent
Birk et al.

(10) Patent No.: US 9,939,476 B2
(45) Date of Patent: Apr. 10, 2018

(54) CAPACITANCE MEASUREMENT

(71) Applicant: ANALOG DEVICES GLOBAL, Hamilton (BM)

(72) Inventors: Christian Steffen Birk, Innishannon (IE); John A. Cleary, Kilmallock (IE); David Sayago Montilla, Limerick (IE); Elizabeth A. Lillis, Athlunkard (IE); Padraig O'Connor, Aherla (IE); Eoin E. English, Pallasgreen (IE); Patrick Pratt, Mallow (IE); Kathleen Embrechts, Kellel-Lo (BE); Wim Rens, Schriek (BE); Jan Crols, Oud-Heverlee (BE)

(73) Assignee: ANALOG DEVICES GLOBAL, Hamilton (BM)

( * ) Notice: Subject to any disclaimer, the term of this patent is extended or adjusted under 35 U.S.C. 154(b) by 170 days.

(21) Appl. No.: 14/866,036

(22) Filed: Sep. 25, 2015

(65) Prior Publication Data
US 2017/0089966 A1    Mar. 30, 2017

(51) Int. Cl.
*G01R 27/26* (2006.01)
*B81C 99/00* (2010.01)

(52) U.S. Cl.
CPC ........ *G01R 27/2605* (2013.01); *B81C 99/003* (2013.01)

(58) Field of Classification Search
CPC ........ H03K 7/08; G01R 27/2611; G05F 3/262
See application file for complete search history.

(56) References Cited

U.S. PATENT DOCUMENTS

| | | | | |
|---|---|---|---|---|
| 5,898,332 A | * | 4/1999 | Lefevre | H04N 5/3743 327/336 |
| 6,933,873 B1 | | 8/2005 | Horsley et al. | |
| 8,154,310 B1 | * | 4/2012 | Maharyta | G06F 3/0416 324/678 |
| 8,188,755 B2 | | 5/2012 | Alini et al. | |
| 8,791,709 B2 | * | 7/2014 | Guo | B81C 99/003 324/679 |
| 8,855,476 B2 | | 10/2014 | Liu et al. | |
| 8,896,327 B2 | | 11/2014 | Brunet et al. | |
| 9,097,748 B2 | * | 8/2015 | Aranovsky | G01R 27/2605 |
| 2011/0169509 A1 | * | 7/2011 | Alini | G02B 7/08 324/686 |
| 2014/0184248 A1 | * | 7/2014 | Chevroulet | G01R 27/26 324/679 |
| 2014/0267880 A1 | | 9/2014 | Aranovsky | |

* cited by examiner

*Primary Examiner* — Jermele M Hollington
*Assistant Examiner* — Alvaro Fortich
(74) *Attorney, Agent, or Firm* — Patent Capital Group

(57) ABSTRACT

Embodiments of the present invention may provide a method of measuring an unknown capacitance of a device. The method may comprise the steps of driving a test signal to a circuit system that includes a current divider formed by the device with unknown capacitance and a reference capacitor; mirroring a current developed in the reference capacitor to a second circuit system that includes a measurement impedance; measuring a voltage within the second circuit system; and deriving a capacitance of the unknown capacitance based on the measured voltage with reference to a capacitance of the reference capacitor and the measurement impedance.

20 Claims, 13 Drawing Sheets

1100

1200

1300

CAPACITANCE MEASUREMENT

BACKGROUND

The present invention generally relates to the measurement of an unknown capacitance of a capacitive device.

Translational systems are used in digital cameras, video recorders, mobile phones, personal digital assistants, and other electronic devices. These translational systems are used to move mechanical systems (for example, a lens assembly) under an electrical control such as auto-focus or optical image stabilization. In such a translational system, a driver integrated circuit generates a drive signal to an actuator, which in turn drives a mechanical system. The driver generates the drive signal in response to an input command that indicates the desired position of the actuator.

An example of an actuator is a MicroElectroMechanical System (MEMS) actuator. A MEMS actuator typically exhibits a non-linear relationship between the amount of current or voltage applied to it and the amount of displacement it produces. MEMS actuator responses also may vary among manufacturing lots of the same MEMS actuator design. Furthermore, operational factors such as temperature and physical orientation with respect to gravitational force may have a substantial effect on the MEMS actuator responses. Consequently, an open-loop controlled MEMS actuator may not reach the desired position prescribed by the input command, leading to inaccurate performance.

A closed-loop control may be used to drive a MEMS actuator such that the closed-loop control corrects for any error between the desired position and the actual position of the MEMS actuator. A closed-loop control, however, employs a feedback signal that represents the actual position of the MEMS actuator. However, the position of a MEMS actuator cannot be directly measured.

Therefore, the inventors recognized a need in the art for measuring the position of a MEMS actuator.

BRIEF DESCRIPTION OF THE DRAWINGS

The present invention will become more fully understood from the detailed description given below and from the accompanying drawings. The drawings are intended to disclose but a few possible examples of the present invention, and thus do not limit the present invention's scope.

DETAILED DESCRIPTION

Embodiments of the present invention may provide a method of measuring an unknown capacitance of a device. The method may comprise the steps of driving a test signal to a circuit system that includes a current divider formed by the device with unknown capacitance and a reference capacitor; mirroring a current developed in the reference capacitor to a second circuit system that includes a measurement impedance; measuring a voltage within the second circuit system; and deriving a capacitance of the unknown capacitance based on the measured voltage with reference to a capacitance of the reference capacitor and the measurement impedance.

Embodiments of the present invention may provide an integrated circuit for measuring an unknown capacitance of a device. The integrated circuit may comprise a current source coupled to an output terminal, a reference capacitor coupled to the output terminal, a current mirror having a pair of current paths—a first current path including the reference capacitor and a second current path including a measurement impedance—and an analog-to-digital converter having an input coupled to a node within the second current path.

Figure 1:
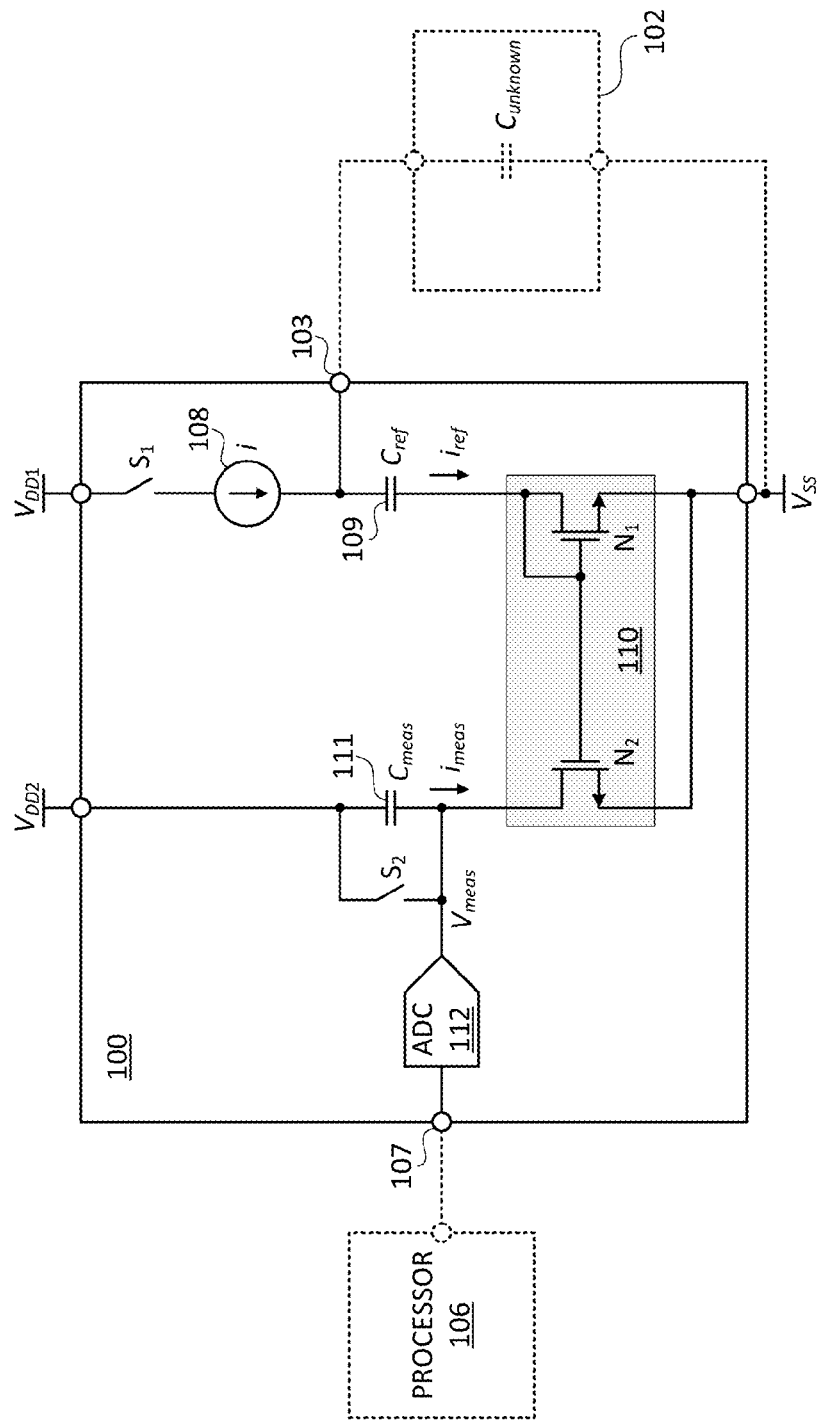
FIG. 1 illustrates a measurement circuit according to an embodiment of the present invention.

FIG. 1 illustrates a measurement circuit 100 for measuring an unknown capacitance $C_{unknown}$ of a capacitive device 102, according to an embodiment of the present invention. The circuit 100 may include a current source 108, a reference capacitor 109, a current mirror 110, a measurement capacitor 111, and an analog-to-digital converter (ADC) 112. The circuit 100 may have an output terminal 103 that is coupled to a first terminal of the capacitive device 102. A second terminal of the capacitive device 102 may be coupled to a reference source such as a low voltage supply $V_{SS}$ (ground). An output of the ADC 112 may be output to an output terminal 107 of the circuit 100 and on to other systems such as a processor 106.

The current source 108 may provide a test current i to the capacitive device 102 and to the reference capacitor 109. The reference capacitor 109, when coupled to the capacitive device 102 may form a current divider. Each branch of the current divider may receive a portion of the test current i supplied by the current source 108 according to their relative capacitances. A current $i_{ref}$ thus may flow through the reference capacitor 109.

The current mirror 110 may include a diode-connected transistor $N_1$ and a second transistor $N_2$ having its gate coupled to a gate of the first transistor $N_1$. Thus, during operation, the second transistor $N_2$ may pass a current in proportion to the current $i_{ref}$ that is passed by the first transistor $N_1$.

The measurement capacitor 111 may carry a voltage across it at a level that is determined by the current $i_{meas}$ passed by the current mirror 110. In the example illustrated in FIG. 1, the measurement capacitor 111 is illustrated as connected between a voltage supply ($V_{DD2}$) and the current mirror 110. In this configuration, when the current $i_{meas}$ is passed by the current mirror 110, a measurement voltage $V_{meas}$ at a node established at a connection between the measurement capacitor 111 and the current mirror 110 may decrease. The ADC 112 may digitize the measurement voltage $V_{meas}$.

In the configuration illustrated in FIG. 1, the current source 108 may be coupled to another voltage supply $V_{DD1}$ via a switch $S_1$. The configuration of FIG. 1 may be convenient for application in circuit systems where a driving voltage $V_{DD1}$ for the capacitive device 102 exceeds a supply voltage $V_{DD2}$ for circuit elements of the circuit 100. For example, in an embodiment of the present invention, the voltage supply $V_{DD1}$ may be 55 V whereas the voltage supply $V_{DD2}$ may be 3.3V. In other circuit applications, however, it may be sufficient to use a single voltage supply (not shown) both to drive the capacitive device 102 and the circuit elements of the circuit 100.

The switch $S_1$ may be controlled by a switch controller (not shown) to provide selective control to enable or disable the current source 108. The switch $S_1$ may be implemented as a transistor (for example, a FET, a 133T, etc.) that is sized to accommodate the driving voltage $V_{DD1}$ to which the current source 108 is connected. When the switch $S_1$ is controlled to be closed, the current source 108 may provide a test current to the capacitive device 102 and to the reference capacitor 109. It may be convenient to have the current source 108 provide the test current at a fixed magnitude (when switch $S_1$ is closed), in which case the amount of charge provided by the current source 108 may be dictated by a period of time t during which the switch $S_1$ remains closed.

The reference capacitor 109 having a capacitance $C_{ref}$ may be coupled in a circuit path from the output terminal 103 through the current mirror 110. As discussed, the capacitor 109 and the capacitive device 102 form a current divider, dividing the test current i supplied by the current source 108. As such, the current $i_{ref}$ flowing through the reference capacitor 109 is a portion of the test current i supplied by the current source 108, dictated by the capacitances $C_{ref}$ and $C_{unknown}$ as:

$$i_{ref} = \frac{C_{ref}}{C_{ref} + C_{unknown}} i \quad (1)$$

As discussed, the current mirror 110 may mirror the current $i_{ref}$ to the measurement capacitor 111 as the current $i_{meas}$. The current mirror 110 is shown as including two n-channel transistors $N_1$ and $N_2$, but other configurations may be applied. For example, the transistors $N_1$ and $N_2$ may be implemented as any other types of transistors (for example, BJTs). And, as discussed below, other current mirrors may be provided with p-type devices. In the configuration illustrated in FIG. 1, the transistors $N_1$ and $N_2$ may have their source terminals coupled to the voltage supply $V_{SS}$, but, again, configurations may vary. In a simple implementation, the transistors $N_1$ and $N_2$ may be provided to have equal sizes and, therefore, the currents passed by the transistors $N_1$ and $N_2$ may be equal to each other ($i_{meas}=i_{ref}$). If desired, however, the transistors $N_1$ and $N_2$ may be sized unequally, in which case the transistor $N_2$ will pass a current $i_{meas}$ corresponding to the relative sizes of the two transistors $N_1$ and $N_2$ ($i_{meas} \propto i_{ref}$). For example, the current $i_{meas}$ may be a factor $\alpha$ of the current $i_{ref}$ as:

$$i_{meas} = \alpha i_{ref} \quad (2)$$

Also in a simple configuration, the reference capacitor 109 and the measurement capacitor 111 may be sized such that the capacitances $C_{meas}$ and $C_{ref}$ are identical ($C_{meas}=C_{ref}$). However, if desired, the reference capacitor 109 and the measurement capacitor 111 may be unequally weighted by a factor of go as:

$$C_{meas} = \varphi C_{ref} \quad (3)$$

As discussed, a voltage may develop across the measurement capacitor 111 as the current i is passed by the current mirror 110. The current $i_{meas}$ may flow as long as the switch $S_1$ is closed, causing the measurement voltage $V_{meas}$ to decrease. When the switch $S_1$ is opened after a period of time t, the voltage across the measurement capacitor 111 may be expressed as:

$$V_{DD2} - V_{meas} = \frac{i_{meas} t}{C_{meas}} \quad (4)$$

Substituting equations (1)-(3) into equation (4) results in:

$$V_{DD2} - V_{meas} = \frac{\alpha}{\varphi(C_{ref} + C_{unknown})} it \quad (5)$$

Therefore, a digital value generated by the ADC 112 may represent the unknown capacitance $C_{unknown}$ of the capacitive device 102 according to:

$$C_{unknown} = \frac{\alpha}{\varphi(V_{DD2} - V_{meas})} it - C_{ref} \quad (6)$$

It should be noted that all the parameters and variables on the right hand side of equation (6) may be known, predetermined, and/or measured. A processor 106 may derive the unknown capacitance $C_{unknown}$ of the capacitive device 102, for example, by direct mathematical computation. Alternatively, the processor 106 may store a lookup table, indexed by digital values output by the ADC 112, that stores capacitance values of the unknown capacitance $C_{unknown}$.

Once the ADC 112 has generated a digital value, to allow for a subsequent capacitance measurement, the voltage across the measurement capacitor 111 may be reset to zero by closing a switch $S_2$ coupled across the measurement capacitor 111. Similar to the switch $S_1$, the switch $S_2$ may be implemented as a transistor (for example, a FET, a 133T, etc.).

Figure 2:
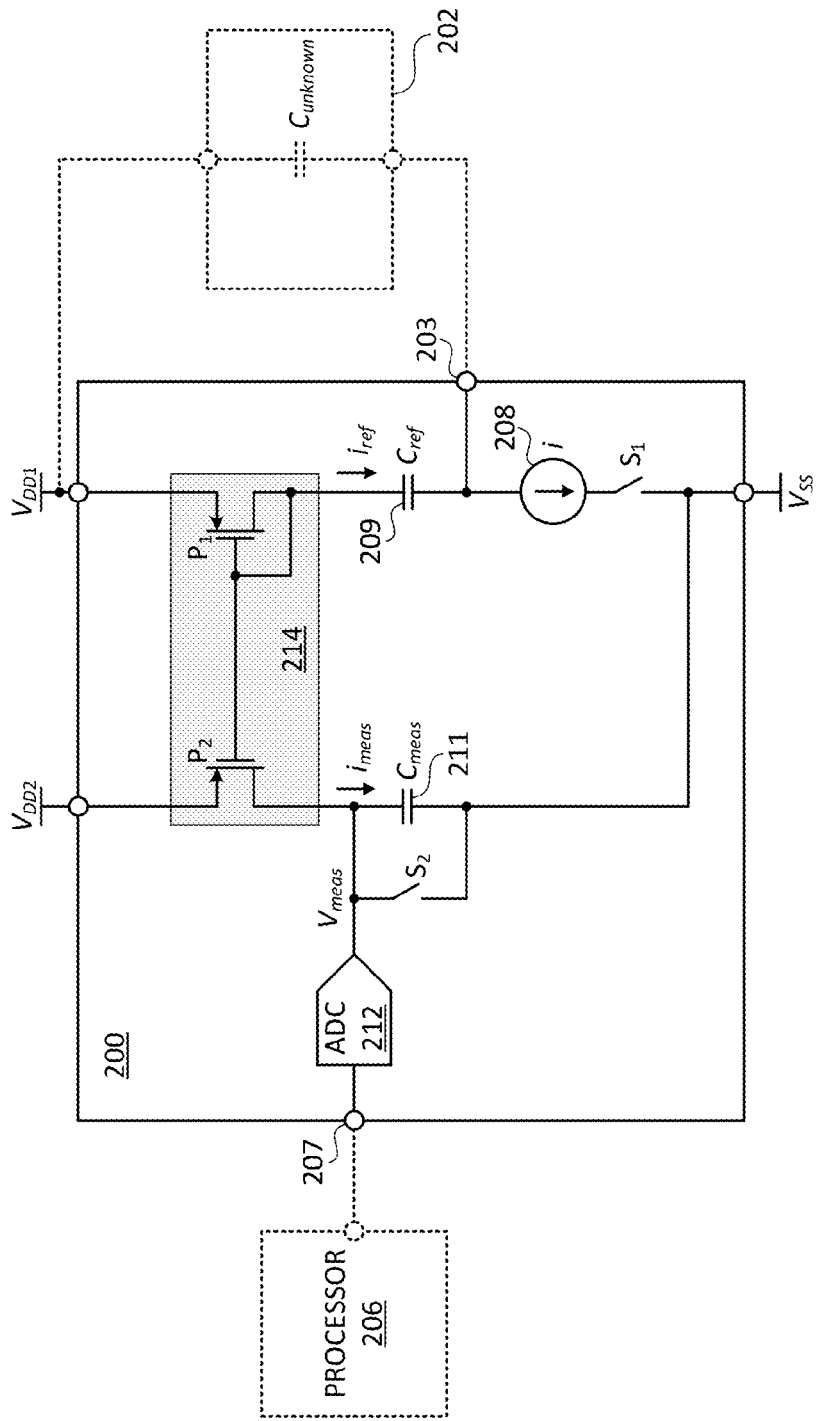
FIG. 2 illustrates a measurement circuit according to an embodiment of the present invention.

FIG. 2 illustrates a measurement circuit 200 for measuring an unknown capacitance $C_{unknown}$ of a capacitive device 202, according to an embodiment of the present invention, wherein a current mirror may be provided with p-type devices. The circuit 200 may include a current source 208, a reference capacitor 209, a current mirror 214, a measurement capacitor 211, and an ADC 212. The circuit 200 may have an output terminal 203 that is coupled to a first terminal of the capacitive device 202. A second terminal of the capacitive device 202 may be coupled to a high voltage supply $V_{DD1}$. An output of the ADC 212 may be output to an output terminal 207 of the circuit 200 and on to other systems such as a processor 206.

The current source 208 may provide a test current i to the capacitive device 202 and to the reference capacitor 209. The reference capacitor 209, when coupled to the capacitive device 202 may form a current divider. Each branch of the current divider may receive a portion of the test current i supplied by the current source 208 according to their relative capacitances. A current $i_{ref}$ thus may flow through the reference capacitor 209.

The current mirror 214 may include a diode-connected transistor $P_1$ and a second transistor $P_2$ having its gate coupled to a gate of the first transistor $P_1$. Thus, during operation, the second transistor $P_2$ may pass a current $i_{meas}$ in proportion to the current $i_{ref}$ that is passed by the first transistor $P_1$.

The measurement capacitor 211 may carry a voltage across it at a level that is determined by the current $i_{meas}$ passed by the current mirror 214. In the example illustrated in FIG. 2, the measurement capacitor 211 is illustrated as connected between the current mirror 214 and a voltage supply $V_{SS}$. In this configuration, when the current $i_{meas}$ is passed by the current mirror 214, a measurement voltage $V_{meas}$ at a node established at a connection between the measurement capacitor 211 and the current mirror 214 may increase. The ADC 212 may digitize the measurement voltage $V_{meas}$.

In the configuration illustrated in FIG. 2, the current source 208 may be coupled to the voltage supply $V_{SS}$ via a switch $S_1$. The switch $S_1$ may be controlled by a switch controller (not shown) to provide selective control to enable or disable the current source 208. When the switch $S_1$ is controlled to be closed, the current source 208 may provide a test current to the capacitive device 202 and to the reference capacitor 209. The current source 208 may provide the test current at a fixed magnitude (when switch $S_1$ is closed). A period of time t during which the switch $S_1$ remains closed may thus determine the amount of charge provided by the current source 208.

The reference capacitor 209 having a capacitance $C_{ref}$ may be coupled in a circuit path from the output terminal 203 through the current mirror 214. As discussed, the capacitor 209 and the capacitive device 202 form a current divider, dividing the test current i supplied by the current source 208. As such, the current $i_{ref}$ flowing through the reference capacitor 209 is a portion of the test current i supplied by the current source 208, dictated by the capacitances $C_{ref}$ and $C_{unknown}$ as represented by equation (1) above.

As discussed, the current mirror 214 may mirror the current $i_{ref}$ to the measurement capacitor 211 as the current $i_{meas}$. The current mirror 214 is shown as including two p-channel transistors $P_1$ and $P_2$, but other configurations may be applied. In the configuration illustrated in FIG. 2, the transistor $P_1$ may have its source terminal coupled to the voltage supply $V_{DD1}$ and the transistor $P_1$ may have its source terminal coupled to another voltage supply $V_{DD2}$. Alternatively, both transistors $P_1$ and $P_2$ may have their source terminals coupled to a single voltage supply (not shown).

In a simple implementation, the transistors $P_1$ and $P_2$ may be provided to have equal sizes and, therefore, the currents passed by the transistors $P_1$ and $P_2$ may be equal to each other ($i_{meas}=i_{ref}$). If desired, however, the transistors $P_1$ and $P_2$ may be sized unequally, in which case the transistor $P_2$ will pass a current $i_{meas}$ corresponding to the relative sizes of the two transistors $P_1$ and $P_2$ ($i_{meas} \propto i_{ref}$). For example, the current $i_{meas}$ may be a factor $\alpha$ of the current $i_{ref}$ as in equation (2).

Also in a simple configuration, the reference capacitor 209 and the measurement capacitor 211 may be sized such that the capacitances $C_{meas}$ and $C_{ref}$ are identical ($C_{meas}=C_{ref}$). However, if desired, the reference capacitor 209 and the measurement capacitor 211 may be unequally sized by a factor of $\varphi$ and the capacitances $C_{meas}$ and $C_{ref}$ may be expressed as in equation (3).

As discussed, a voltage may develop across the measurement capacitor 211 as the current $i_{meas}$ passed by the current mirror 214. The current $i_{meas}$ may flow as long as the switch $S_1$ is closed, causing the measurement voltage $V_{meas}$ increase. When the switch $S_1$ is opened after a period of time t, the voltage across the measurement capacitor 211 may be expressed as:

$$V_{meas} - V_{SS} = \frac{i_{meas}t}{C_{meas}} \quad (7)$$

Substituting equations (1)-(3) into equation (7) results in:

$$V_{meas} - V_{SS} = \frac{\alpha}{\varphi(C_{ref} + C_{unknown})}it \quad (8)$$

Therefore, a digital value generated by the ADC 212 may represent the unknown capacitance $C_{unknown}$ of the capacitive device 202 according to:

$$C_{unknown} = \frac{\alpha}{\varphi(V_{meas} - V_{SS})}it - C_{ref} \quad (9)$$

All the parameters and variables on the right hand side of equation (9) may be known, predetermined, and/or measured. A processor 206 may derive the unknown capacitance $C_{unknown}$ of the capacitive device 202, for example, by direct mathematical computation. Alternatively, the processor 206 may store a lookup table, indexed by digital values output by the ADC 212, that stores capacitance values of the unknown capacitance $C_{unknown}$.

Once the ADC 212 has generated a digital value, to allow for a subsequent capacitance measurement, the voltage across the measurement capacitor 211 may be reset to zero by closing a switch $S_2$ coupled across the measurement capacitor 211.

FIGS. 1 and 2 illustrate circuit configurations in which the capacitive device 102/202 and the reference capacitor 109/209 are connected in parallel between the output node 103/203 and a common voltage reference. Such configurations are not required in all embodiments. In other configurations, the capacitive device 102 may extend between the output terminal 103 and a first voltage supply (say, $V_{SS}$) and the reference capacitor 109 may be provided in a circuit path between the output terminal 103 and a second voltage supply (say, $V_{DD}$). In such embodiments, so long as the capacitive device 102 and the reference capacitor 109 cooperate as a current divider, the measurement techniques described in FIGS. 1 and 2 remain appropriate. In certain configurations, the reference capacitors and the measurement capacitors may be substituted by other impedance devices, for example, resistors.

Figure 3:
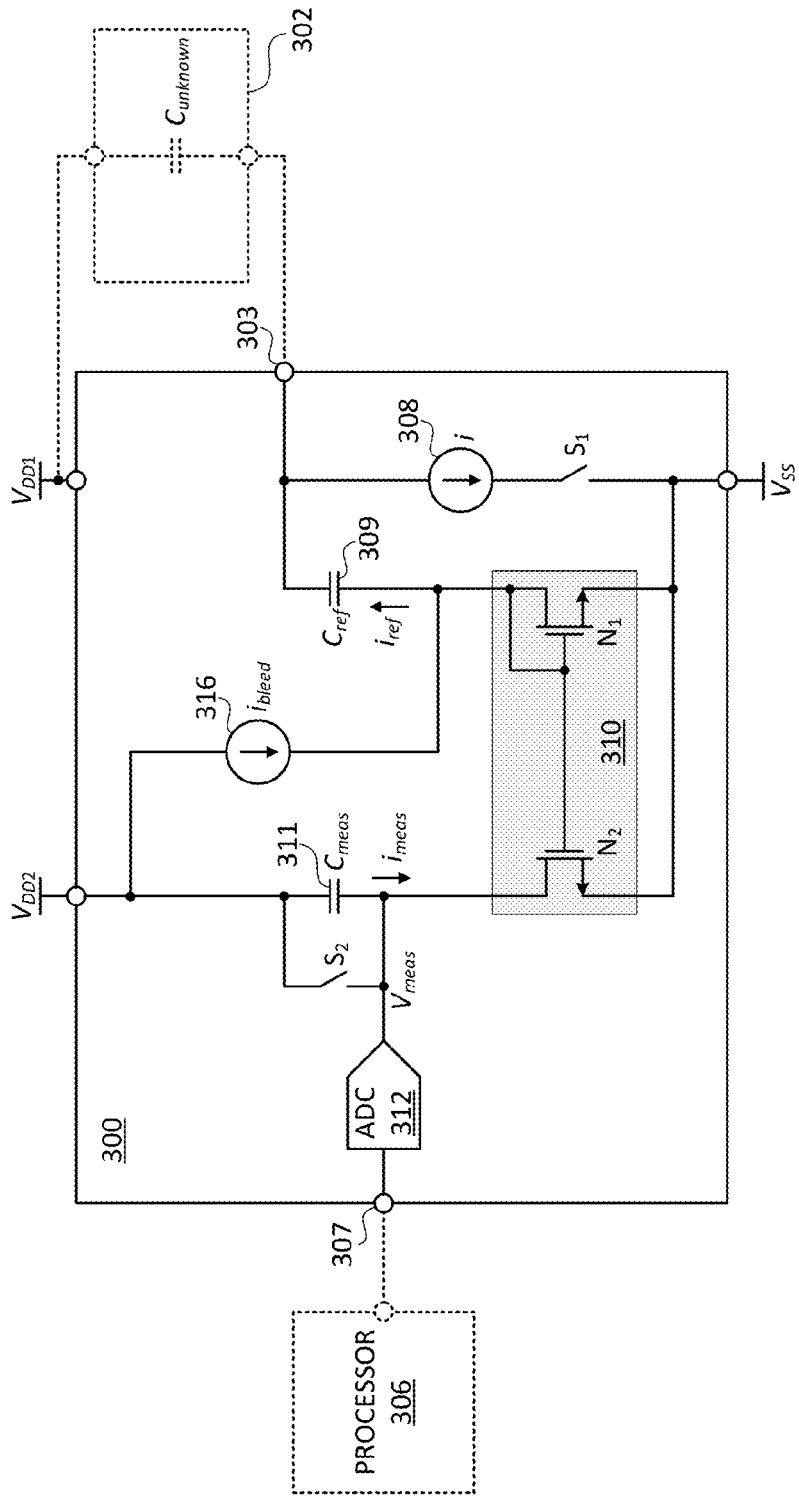
FIG. 3 illustrates a measurement circuit according to an embodiment of the present invention.

FIG. 3 illustrates a measurement circuit 300 for measuring an unknown capacitance $C_{unknown}$ of a capacitive device 302, according to an embodiment of the present invention. The circuit 300 may include a current source 308, a reference capacitor 309, a current mirror 310, a measurement capacitor 311, an ADC 312, and a "bleeding" current source 316. The circuit 300 is similar to the circuit 100 in FIG. 1, except that the current source 308 may be connected on the low voltage supply $V_{SS}$ side, thereby requiring the bleeding current source 316, as discussed below. The circuit 300 may have an output terminal 303 that is coupled to a first terminal of the capacitive device 302. A second terminal of the capacitive device 302 may be coupled to a high voltage supply $V_{DD1}$. An output of the ADC 312 may be output to an output terminal 307 of the circuit 300 and on to other systems such as a processor 306.

The current source 308 may provide a test current i, sourcing a current to the capacitive device 302 and sinking a current $i_{ref}$ from the reference capacitor 309. The reference capacitor 309, when coupled to the capacitive device 302 may form a current divider. Each branch of the current divider may contribute a portion of the test current i provided by the current source 308 according to their relative capacitances.

The bleeding current source 316 may supply a current at a second level $i_{bleed}$ at a node formed by connection of the reference capacitor 309 and the current mirror 310. The current source 308 and bleeding current source 316 may cooperate to supply an aggregate current $i_{bleed}-i_{ref}$ through a first branch of the current mirror 310. In practice, the bleeding current $i_{bleed}$ may be sized to ensure that the aggregate current is positive for all practical values of the unknown capacitance $C_{unknown}$ (i.e., $i_{bleed} > i_{ref}$).

The current mirror 310 may include a diode-connected transistor $N_1$ and a second transistor $N_2$ having its gate coupled to a gate of the first transistor $N_1$. During operation, the second transistor $N_2$ may pass a current $i_{meas}$ in proportion to the aggregate current $i_{bleed}-i_{ref}$ that is passed by the first transistor $N_1$.

The measurement capacitor 311 may carry a voltage across it at a level that is determined by the current $i_{meas}$ passed by the current mirror 310. In the example illustrated in FIG. 3, the measurement capacitor 311 is illustrated as connected between a voltage supply $V_{DD2}$ and the current mirror 310. In this configuration, when the current $i_{meas}$ is passed by the current mirror 310, a measurement voltage $V_{meas}$ at a node established at a connection between the measurement capacitor 311 and the current mirror 310 may decrease. The ADC 312 may digitize the measurement voltage $V_{meas}$.

In the configuration illustrated in FIG. 3, the current source 308 may be coupled to the voltage supply $V_{SS}$ via a switch $S_1$. The switch $S_1$ may be controlled by a switch controller (not shown) to provide selective control to enable or disable the current source 308. When the switch $S_1$ is controlled to be closed, the current source 308 may provide a test current to the capacitive device 302 and to the reference capacitor 309. The current source 308 may provide the test current at a fixed magnitude (when switch S1 is closed). A period of time t during which the switch $S_1$ remains closed may thus determine the amount of charge provided by the current source 308.

The reference capacitor 309 having a capacitance $C_{ref}$ may be coupled in a circuit path from the output terminal 303 through the current mirror 310. As discussed, the capacitor 309 and the capacitive device 302 form a current divider, dividing the test current i supplied by the current source 308. As such, the current $i_{ref}$ flowing through the reference capacitor 309 is a portion of the test current i supplied by the current source 308, dictated by the capacitances $C_{ref}$ and $C_{unknown}$ as represented by equation (1) above.

As discussed, the current mirror 310 may mirror the aggregate current $i_{bleed}-i_{ref}$ to the measurement capacitor 311 as the current $i_{meas}$. The current mirror 310 is shown as including two n-channel transistors $N_1$ and $N_2$, but other configurations may be applied. In the configuration illustrated in FIG. 3, the transistors $N_1$ and $N_2$ may have their source terminals coupled to the voltage supply $V_{SS}$, but, again, configurations may vary.

In a simple implementation, the transistors $N_1$ and $N_2$ may be provided to have equal sizes and, therefore, the currents passed by the transistors $N_1$ and $N_2$ may be equal to each other ($i_{meas}=i_{bleed}-i_{ref}$). If desired, however, the transistors $N_1$ and $N_2$ may be sized unequally, in which case the transistor $N_2$ will pass a current $i_{meas}$ corresponding to the relative sizes of the two transistors $N_1$ and $N_2$ ($i_{meas} \propto (i_{bleed}-i_{ref})$). For example, the current $i_{meas}$ may be a factor $\alpha$ of the aggregate current $i_{bleed}-i_{ref}$ as:

$$i_{meas}=\alpha(i_{bleed}-i_{ref}) \qquad (10)$$

Also in a simple configuration, the reference capacitor 309 and the measurement capacitor 311 may be sized such that the capacitances $C_{meas}$ and $C_{ref}$ are identical ($C_{meas}=C_{ref}$). However, if desired, the reference capacitor 309 and the measurement capacitor 311 may be unequally sized by a factor of $\varphi$ and the capacitances $C_{meas}$ and $C_{ref}$ may be expressed as in equation (3).

As discussed, a voltage may develop across the measurement capacitor 311 as the current $i_{meas}$ is passed by the current mirror 310. The current $i_{meas}$ may flow as long as the switch $S_1$ is closed, causing the measurement voltage $V_{meas}$ to measurement decrease. When the switch $S_1$ is opened after a period of time t, the voltage across the measurement capacitor 311 may be expressed as:

$$V_{DD2}-V_{meas}=\frac{i_{meas}t}{C_{meas}} \qquad (11)$$

Substituting equations (1), (3), and (10) into equation (11) results in:

$$V_{DD2}-V_{meas}=\frac{\alpha i_{bleed}t}{\varphi C_{ref}}-\frac{\alpha}{\varphi(C_{ref}+C_{unknown})}it \qquad (12)$$

Therefore, a digital value generated by the ADC 312 may represent the unknown capacitance $C_{unknown}$ of the capacitive device 302 according to:

$$C_{unknown}=\frac{\alpha}{\varphi\left(\frac{\alpha i_{bleed}t}{\varphi C_{ref}}-V_{DD2}+V_{meas}\right)}it-C_{ref} \qquad (13)$$

All the parameters and variables on the right hand side of equation (13) may be known, predetermined, and/or measured. A processor 306 may derive the unknown capacitance $C_{unknown}$ of the capacitive device 302, for example, by direct mathematical computation. Alternatively, the processor 306 may store a lookup table, indexed by digital values output by the ADC 312, that stores capacitance values of the unknown capacitance $C_{unknown}$.

Once the ADC 312 has generated a digital value, to allow for a subsequent capacitance measurement, the voltage across the measurement capacitor 311 may be reset to zero by closing a switch $S_2$ coupled across the measurement capacitor 311.

Figure 4:
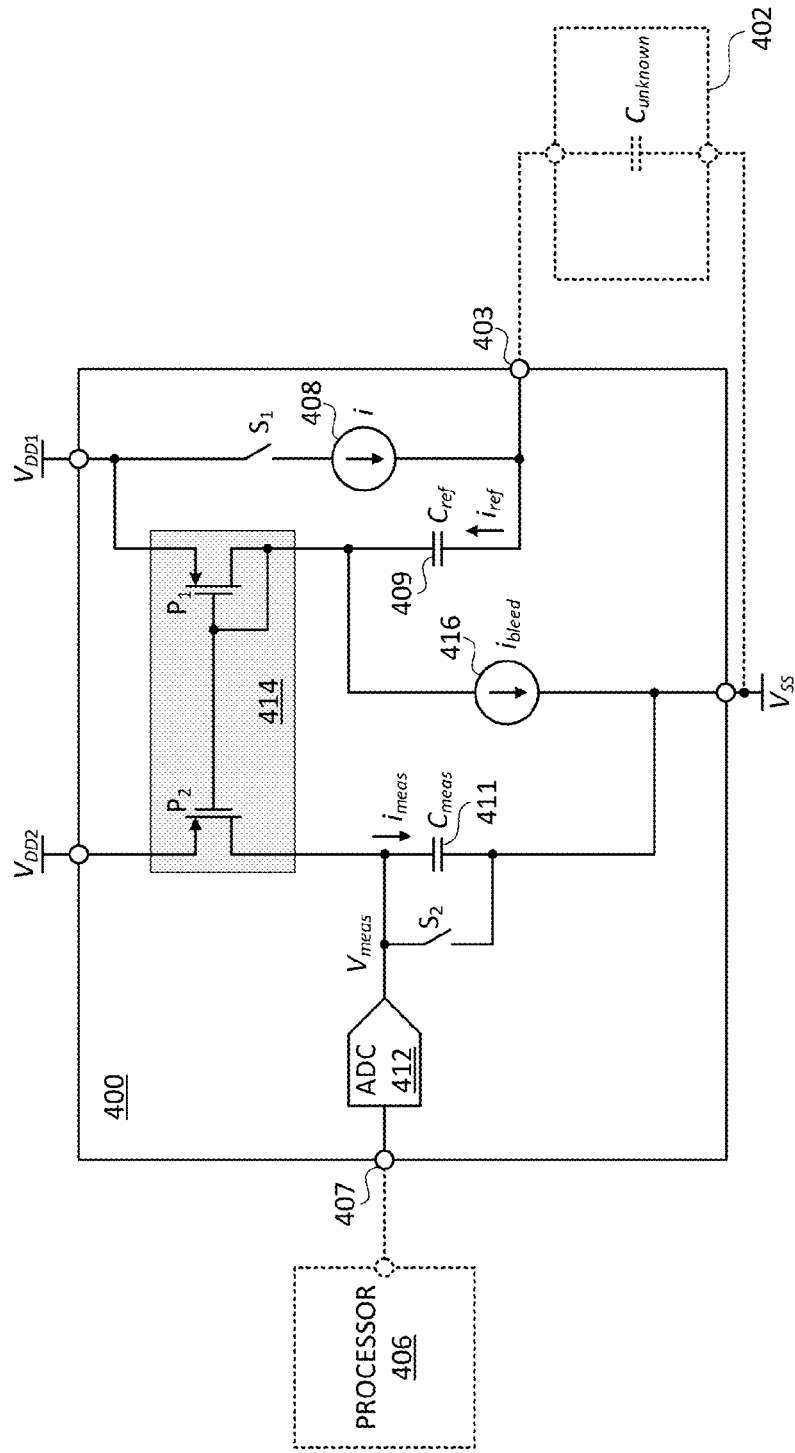
FIG. 4 illustrates a measurement circuit according to an embodiment of the present invention.

FIG. 4 illustrates a measurement circuit 400 for measuring an unknown capacitance $C_{unknown}$ of a capacitive device 402, according to an embodiment of the present invention. The circuit 400 may include a current source 408, a reference capacitor 409, a current mirror 414, a measurement capacitor 411, an ADC 412, and a "bleeding" current source 416. The circuit 400 is similar to the circuit 200 in FIG. 2, except that the current source 408 may be connected on the high voltage supply $V_{DD1}$ side, thereby requiring the bleeding current source 416, as discussed below. The circuit 400 may have an output terminal 403 that is coupled to a first terminal of the capacitive device 402. A second terminal of the capacitive device 402 may be coupled to a high voltage supply $V_{DD1}$. An output of the ADC 412 may be output to an output terminal 407 of the circuit 400 and on to other systems such as a processor 406.

The current source 408 may provide a test current i, sourcing a current to the capacitive device 402 and sinking a current $i_{ref}$ from the reference capacitor 409. The reference capacitor 409, when coupled to the capacitive device 402 may form a current divider. Each branch of the current divider may contribute a portion of the test current i provided by the current source 408 according to their relative capacitances.

The bleeding current source 416 may supply a current at a second level $i_{bleed}$ at a node formed by connection of the reference capacitor 409 and the current mirror 414. The current source 408 and bleeding current source 416 may cooperate to supply an aggregate current $i_{bleed}-i_{ref}$ through a first branch of the current mirror 414. In practice, the bleeding current $i_{bleed}$ may be sized to ensure that the aggregate current is positive for all practical values of the unknown capacitance $C_{unknown}$ (i.e., $i_{bleed} > i_{ref}$).

The current mirror 414 may include a diode-connected transistor $P_1$ and a second transistor $P_2$ having its gate coupled to a gate of the first transistor $P_1$. During operation, the second transistor $P_2$ may pass a current $i_{meas}$ in proportion to an aggregate current $i_{bleed}-i_{ref}$ that is passed by the first transistor $P_1$.

The measurement capacitor 411 may carry a voltage across it at a level that is determined by the current $i_{meas}$ passed by the current mirror 414. In the example illustrated in FIG. 4, the measurement capacitor 411 is illustrated as connected between the current mirror 414 and a voltage supply $V_{SS}$. In this configuration, when the current $i_{meas}$ is passed by the current mirror 414, a measurement voltage $V_{meas}$ at a node established at a connection between the measurement capacitorm capacitor 411 and the current 414 may increase. The ADC 412 may digitize the measurement voltage $V_{meas}$.

In the configuration illustrated in FIG. 4, the current source 408 may be coupled to the voltage supply $V_{DD1}$ via a switch $S_1$. The switch $S_1$ may be controlled by a switch controller (not shown) to provide selective control to enable or disable the current source 408. When the switch $S_1$ is controlled to be closed, the current source 408 may provide a test current to the capacitive device 402 and to the reference capacitor 409. The current source 408 may provide the test current at a fixed magnitude (when switch $S_1$ is closed). A period of time t during which the switch $S_1$ remains closed may thus determine the amount of charge provided by the current source 408.

The reference capacitor 409 having a capacitance $C_{ref}$ may be coupled in a circuit path from the output terminal 403 through the current mirror 414. As discussed, the capacitor 409 and the capacitive device 402 form a current divider, dividing the test current i supplied by the current source 408. As such, the current $i_{ref}$ flowing through the reference capacitor 409 is a portion of the test current i supplied by the current source 408, dictated by the capacitances $C_{ref}$ and $C_{unknown}$ as represented by equation (1) above.

As discussed, the current mirror 414 may mirror the aggregate current $i_{bleed}-i_{ref}$ to the measurement capacitor 411 as the current $i_{meas}$. The current mirror 414 is shown as including two p-channel transistors $P_1$ and $P_2$, but other configurations may be applied. In the configuration illustrated in FIG. 4, the transistor $P_1$ may have its source terminal coupled to the voltage supply $V_{DD1}$ and the transistor $P_1$ may have its source terminal coupled to another voltage supply $V_{DD2}$. Alternatively, both transistors $P_1$ and $P_2$ may have their source terminals coupled to a single voltage supply (not shown).

In a simple implementation, the transistors $P_1$ and $P_2$ may be provided to have equal sizes and, therefore, the currents passed by the transistors $P_1$ and $P_2$ may be equal to each other ($i_{meas}=i_{bleed}-i_{ref}$). If desired, however, the transistors $P_1$ and $P_2$ may be sized unequally, in which case the transistor $N_2$ will pass a current $i_{meas}$ corresponding to the relative sizes of the two transistors $P_1$ and $P_2$ ($i_{meas}$ ($i_{bleed}-i_{ref}$)). For example, the current $i_{meas}$ may be a factor α of the aggregate current $i_{bleed}-i_{ref}$ as in equation (10) above.

Also in a simple configuration, the reference capacitor 409 and the measurement capacitor 411 may be sized such that the capacitances $C_{meas}$ and $C_{ref}$ are identical ($C_{meas}=C_{ref}$). However, if desired, the reference capacitor 409 and the measurement capacitor 411 may be unequally sized by a factor of φ and the capacitances $C_{meas}$ and $C_{ref}$ may be expressed as in equation (3) above.

As discussed, a voltage may develop across the measurement capacitor 411 as the current $i_{meas}$ is passed by the current mirror 414. The current $i_{meas}$ may flow as long as the switch $S_1$ is closed, causing the measurement voltage $V_{meas}$ to increase. When the switch $S_1$ is opened after a period of time t, the voltage across the measurement capacitor 411 may be expressed as:

$$V_{meas} - V_{SS} = \frac{i_{meas}t}{C_{meas}} \quad (14)$$

Substituting equations (1), (3), and (10) into equation (14) results in:

$$V_{meas} - V_{SS} = \frac{\alpha i_{bleed} t}{\varphi C_{ref}} - \frac{\alpha}{\varphi(C_{ref} + C_{unknown})} it \quad (15)$$

Therefore, a digital value generated by the ADC 412 may represent the unknown capacitance $C_{unknown}$ of the capacitive device 402 according to:

$$C_{unknown} = \frac{\alpha}{\varphi\left(\frac{\alpha i_{bleed} t}{\varphi C_{ref}} - V_{meas} + V_{SS}\right)} it - C_{ref} \quad (16)$$

All the parameters and variables on the right hand side of equation (16) may be known, predetermined, and/or measured. A processor 406 may derive the unknown capacitance $C_{unknown}$ of the capacitive device 402, for example, by direct mathematical computation. Alternatively, the processor 406 may store a lookup table, indexed by digital values output by the ADC 412, that stores capacitance values of the unknown capacitance $C_{unknown}$.

Once the ADC 412 has generated a digital value, to allow for a subsequent capacitance measurement, the voltage across the measurement capacitor 411 may be reset to zero by closing a switch $S_2$ coupled across the measurement capacitor 411.

Figure 5:
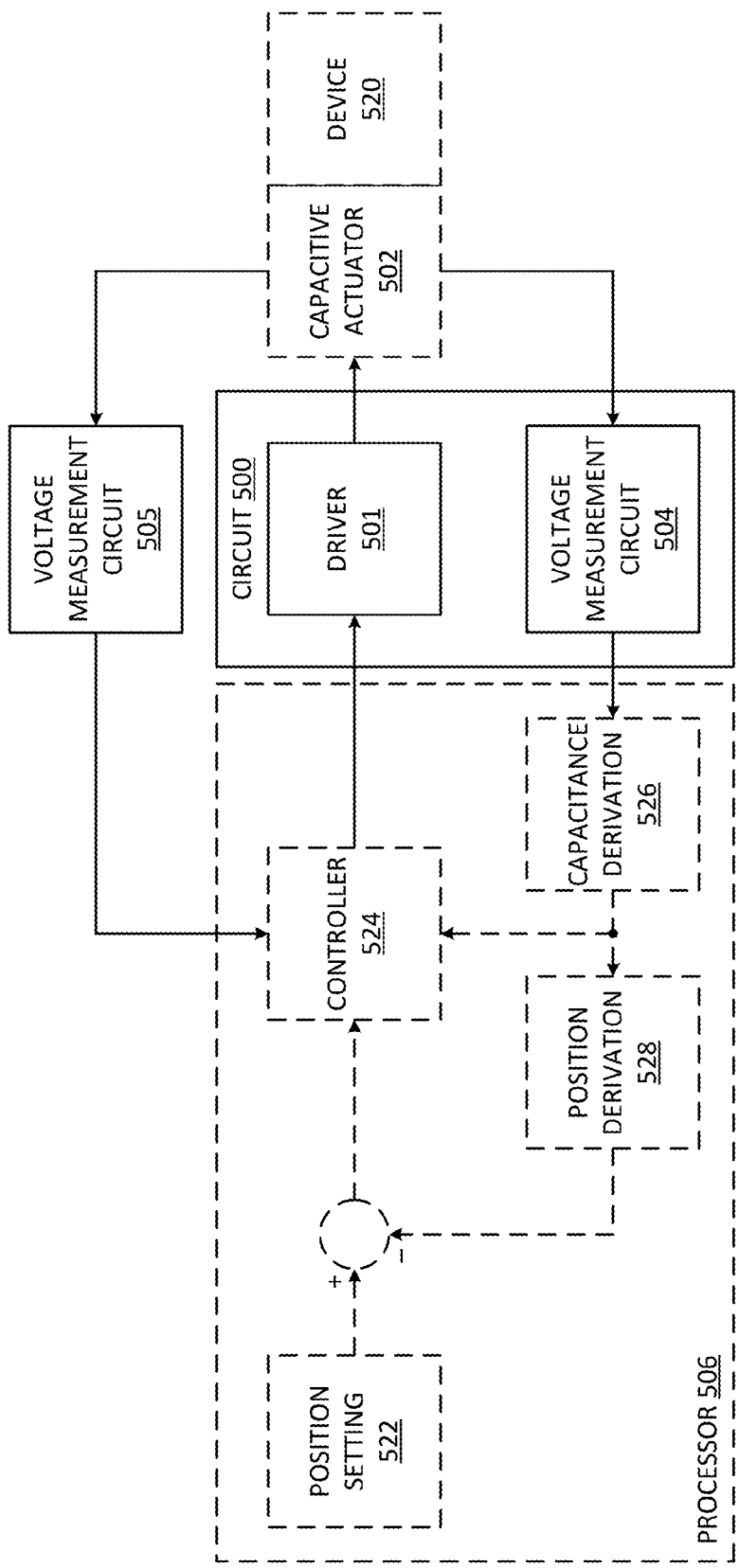
FIG. 5 illustrates a block diagram of an actuation system according to an embodiment of the present invention.
Figure 7:
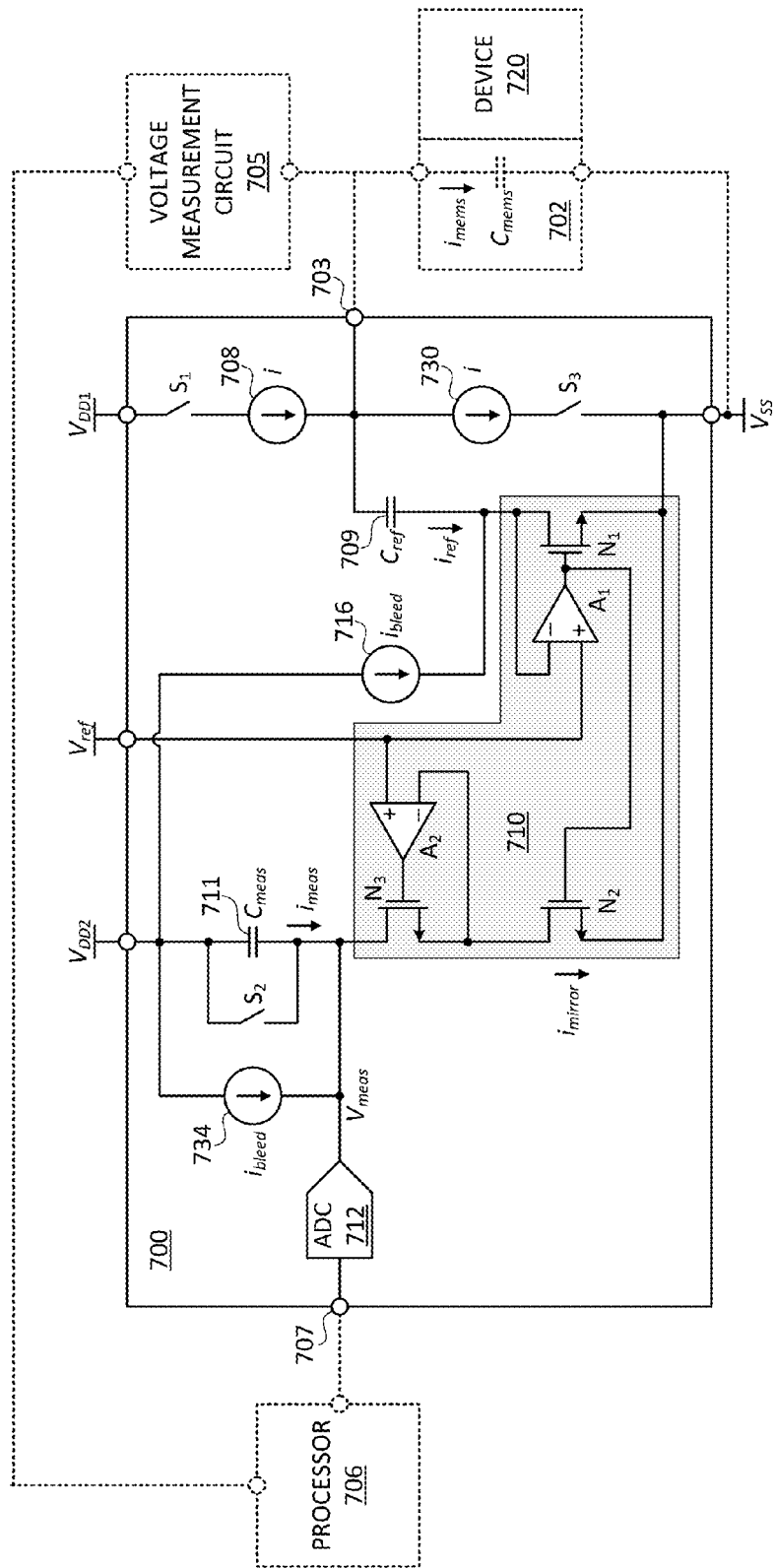
FIG. 7 illustrates a driver and voltage measurement circuit according to an embodiment of the present invention.
Figure 8:
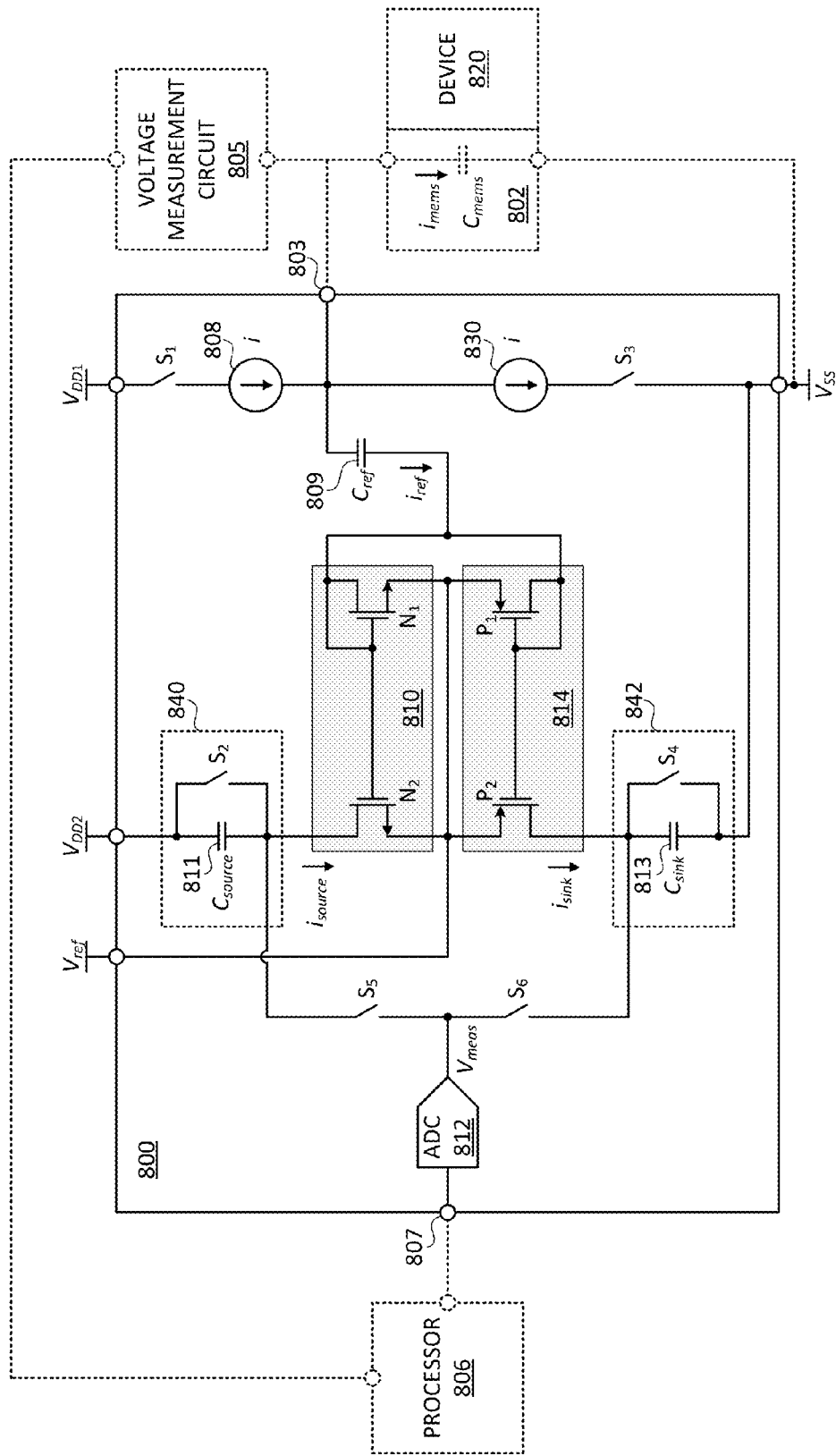
FIG. 8 illustrates a driver and voltage measurement circuit according to an embodiment of the present invention.
Figure 9:
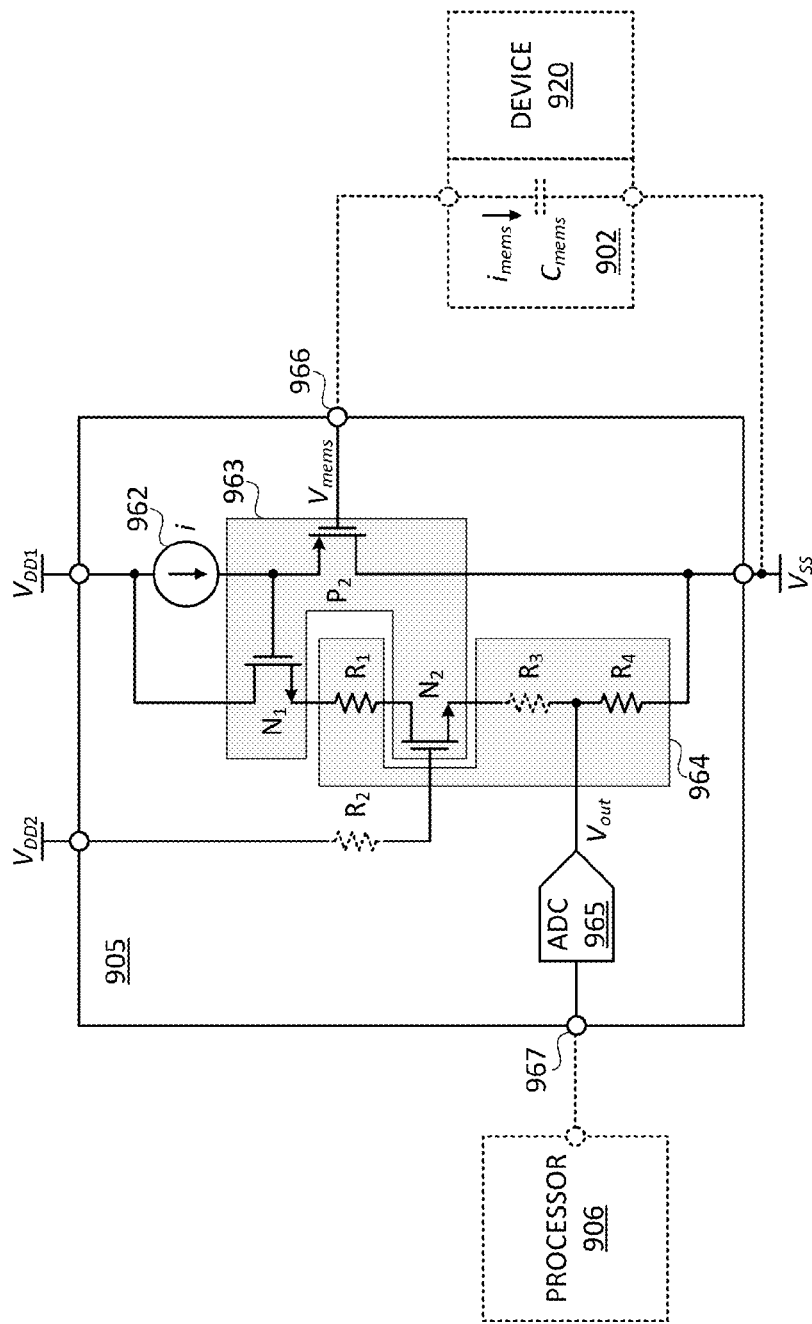
FIG. 9 illustrates a voltage measurement circuit according to an embodiment of the present invention.

FIG. 5 illustrates a block diagram of an actuation system for a capacitive actuator 502 connected to a device 520, according to an embodiment of the present invention. The actuation system may include a circuit 500, a voltage measurement circuit 505, and a processor 506. The circuit 500 may include a driver 501 to provide a drive signal to the actuator 502 and a voltage measurement circuit 504 to develop a voltage representative of the capacitance of the actuator 502. The voltage measurement circuit 505 may measure a voltage across the capacitive actuator 502. Although shown as separate from the circuit 500, in certain embodiments, the voltage measurement circuit 505 may be integral to the circuit 500. Detailed examples of the circuit 500 are illustrated in FIGS. 7 and 8, which are described below. A detailed example of the voltage measurement circuit 505 is illustrated in FIG. 9, which is described below. The processor 506 may include a position setting system 522, a controller 524, a capacitance derivation system 526, and a position derivation system 528.

The driver 501 of the circuit 500 may apply a current to the actuator 502 to change the position of the device 520. An example of the actuator 502 may be a MicroElectroMechanical System (MEMS) actuator, which may be in the form of a cantilever beam or a comb structure. The device 520, a lens assembly for example, may be attached to the cantilever beam or the comb structure of the actuator 502. When the driver 501 applies a current to the actuator 502, the cantilever beam or the comb structure may be displaced, changing the position of the device 520. The displacement of the actuator 502 may result in a change in capacitance of the actuator 502.

As discussed, the first voltage measurement circuit 504 may develop a voltage representative of the capacitance of the actuator 502. The circuit 500 may convert the developed voltage to a digital value and output it to the processor 506. The capacitance derivation system 526 of the processor 506 may derive the capacitance of the actuator 502 based on the digital value representing the developed voltage, for example, by direct mathematical computation. Alternatively, the processor 506 may store a lookup table, indexed by digital values output by the voltage measurement circuit 504, that stores capacitance values of the actuator 502. The derived capacitance may be provided to the position derivation system 528 and the controller 524.

The position derivation system 528 of the processor 506 may then derive an actual position of the actuator 502 based on the derived capacitance. The processor 506 may store another look up table, indexed by capacitance values from the capacitance derivation system 528, that stores position values of the actuator 502.

The position setting system 522 may provide a command signal indicating a desired position of the actuator 502 (and the device 520). The processor 506 may thus compute a position error signal between the desired position and the actual position derived by the position derivation system 528, and provide the position error signal to the controller 524.

Figure 6:
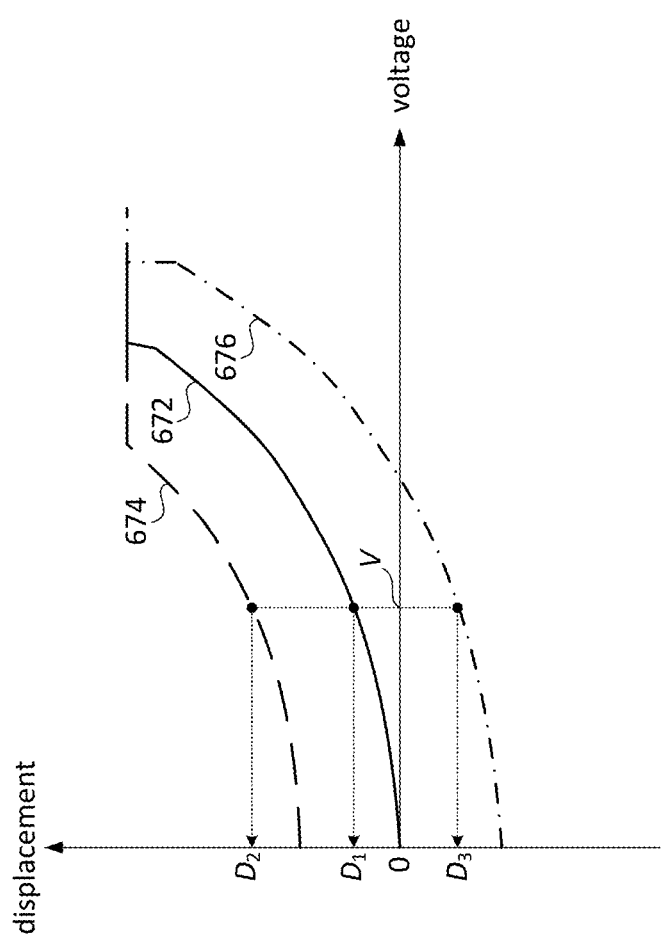
FIG. 6 illustrates an exemplary characteristic of a capacitive actuator according to an embodiment of the present invention.

As discussed, operational factors such as temperature and physical orientation with respect to gravitational forces may have a substantial effect on a capacitive actuator. Thus, it is desirable to take gravitational forces into account when driving such an actuator to a desired position. FIG. 6 illustrates an exemplary characteristic 600 of a capacitive actuator under different gravitational forces. In particular, FIG. 6 illustrates a set of representative displacement-versus-voltage transfer curves for a capacitive actuator, under zero gravitational force (curve 672), positive gravitational force (curve 674), and negative gravitational force (curve 676). It is understood that a plurality of such transfer curves may exist in the displacement-versus-voltage domain. For a given actuator, these transfer curves may be obtained, during calibration of the actuator for example, and stored as lookup tables. Alternatively, since there is a linear relationship between a displacement of a capacitive actuator and its capacitance, capacitance-versus-voltage transfer curves for different gravitational forces may be obtained and stored as lookup tables. As can be seen in FIG. 6, a given voltage V may correspond to three different displacements $D_1$, $D_2$, and $D_3$ according to the gravitational forces. Therefore, if the voltage across the capacitive actuator and its actual position (or capacitance) are known, the gravitational force acting on the actuator may be deduced from the lookup tables. The amount of charge required to drive the actuator to a desired position may then be derived from a lookup table corresponding to the deduced gravitational force.

As such, referring back to FIG. 5, the voltage measurement circuit 505 may be employed to measure a voltage across the capacitive actuator 502, digitize it into a digital value, and provide it to the controller 524 of the processor 506.

Based on the digitized voltage from the voltage measurement circuit 505 and the derived capacitance from the capacitance derivation system 526, the controller 524 may deduce the gravitational force acting on the actuator. The processor 506 may store a plurality of capacitance-versus-voltage transfer curves lookup tables or sub-tables, indexed by capacitance and voltage values. The controller 524 may then compute the amount of charge required to drive the actuator to the desired position based on the transfer curve lookup table corresponding to the deduced gravitational force. The controller 524 may further convert the required amount of charge into a control signal (for example, a duration for a drive current) and provide it to the driver 501 of the circuit 500 in order to drive the position error signal to zero, in which case the actual position of the actuator 502 is at the desired position.

FIG. 7 illustrates a driver and voltage measurement circuit 700 for a capacitive actuator 702 having a variable capacitance $C_{mems}$ and connected to a device 720, according to an embodiment of the present invention. Unlike the circuits in FIGS. 1-4, the circuit 700 may allow current to be sourced to and sunk from the capacitive actuator 702, while allowing capacitance measurement in both situations. The circuit 700 may include a first current source 708, a second current sink 730, a reference capacitor 709, a current mirror 710, a measurement capacitor 711, an ADC 712, a first bleeding current source 716, and a second bleeding current source 734.

The circuit 700 may have an output terminal 703 that is coupled to a first terminal of the capacitive actuator 702. A second terminal of the capacitive actuator 702 may be coupled to a low voltage supply $V_{SS}$. An output of the ADC 712 may be output to an output terminal 707 of the circuit 700 and on to other systems such as a processor 706.

The current source 708 may provide a current i to charge both the capacitive device 702 and the reference capacitor 709. The current sink 730 may provide a current i to discharge both the capacitive actuator 702 and the reference capacitor 709. As discussed below, the current source 708 and the current sink 730 may be used during both a driving interval and a capacitance measurement interval of the capacitive actuator 702. The reference capacitor 709, when coupled to the capacitive actuator 702 may form a current divider. Each branch of the current divider may receive a portion of the current i from either the current source 708 or the current sink 730 according to their relative capacitances. A current $i_{ref}$ thus may flow through the reference capacitor 709. Using the convention of the arrow shown in FIG. 7, the current $i_{ref}$ may be positive when the current source 708 is enabled and negative when the current sink 730 is enabled.

The current mirror 710 may include a transistor $N_1$ and a second transistor $N_2$ having its gate coupled to a gate of the first transistor $N_1$. Since the current $i_{ref}$ may be either positive or negative with respect to the current path of the transistor $N_1$, the bleeding current source 716 may be sized to ensure that the aggregate current $i_{bleed}+i_{ref}$ is positive for all practical values of the unknown capacitance $C_{unknown}$. However, during an abnormal operation where a negative current $i_{ref}$ may become greater in magnitude than the current $i_{bleed}$, a first comparator $A_1$ and a second comparator $A_2$, along with a third transistor $N_3$, may be provided to effectively disable the current mirror 710. Thus, during normal operation, the second transistor $N_2$ may pass a current $i_{mirror}$ in proportion to an aggregate current $i_{bleed}+i_{ref}$ that is passed by the first transistor $N_1$. In a simple implementation, the transistors $N_1$ and $N_2$ may be provided to have equal sizes and, therefore, the currents passed by the transistors $P_1$ and $P_2$ may be equal to each other ($i_{mirror}=i_{bleed}+i_{ref}$).

The measurement capacitor 711 may carry a voltage across it at a level that is determined by the current $i_{meas}$. In the example illustrated in FIG. 7, the measurement capacitor 711 is illustrated as connected between the current mirror 710 and a voltage supply $V_{DD2}$, with the bleeding current source 734 connected across it. The bleeding current source 734 may intentionally be configured to supply a current $i_{bleed}$ similar to the bleeding current source 716. In this configuration, when the transistors $N_1$ and $N_2$ are equally sized, the current $i_{meas}$ may thus be equal to the current $i_{ref}$ (i.e., $i_{meas}=i_{mirror}-i_{bleed}=i_{ref}$). As the current/meas passes through the measurement capacitor 711, a measurement voltage $V_{meas}$ at a node established at a connection between the measurement capacitor 711 and the current mirror 710 may decrease. The ADC 712 may digitize the measurement voltage $V_{meas}$.

In the configuration illustrated in FIG. 7, the current source 708 may be coupled to the voltage supply $V_{DD1}$ via a switch $S_1$. The switch $S_1$ may be controlled by a switch controller (not shown) to provide selective control to enable or disable the current source 708. When the switch $S_1$ is controlled to be closed, the current source 708 may provide a charging current to the capacitive actuator 702 and to the reference capacitor 709. The current source 708 may provide the charging current at a fixed magnitude (when switch $S_1$ is closed). A period of time t during which the switch $S_1$ remains closed may thus determine the amount of charge provided by the current source 708.

The current sink 730 may be coupled to the voltage supply $V_{SS}$ via a switch $S_3$. The switch $S_3$ may be controlled by the switch controller to provide selective control to enable or disable the current sink 730. When the switch $S_3$ is controlled to be closed, the current sink 730 may provide a discharging current to the capacitive actuator 702 and to the reference capacitor 709. The current sink 730 may provide the discharging current at a fixed magnitude (when switch $S_3$ is closed). A period of time t during which the switch $S_3$ remains closed may thus determine the amount of charge removed by the current sink 730. It should be noted that only one between switches $S_1$ and $S_3$ may be closed at a time. In other words, the current sources 708 and 730 may not be enabled at the same time.

The reference capacitor 709 having a capacitance $C_{ref}$ may be coupled in a circuit path from the output terminal 703 through the current mirror 710. As discussed, the capacitor 709 and the capacitive actuator 702 form a current divider, dividing the current i from either the current source 708 or the current sink 730. As such, the current $i_{ref}$ flowing through the reference capacitor 709 is a portion of the current i from either the current source 708 or the current sink 730, dictated by the capacitances $C_{ref}$ and $C_{mems}$ as represented:

$$i_{ref} = \frac{C_{ref}}{C_{ref} + C_{mems}} i \quad (17)$$

As discussed, the current mirror 710 may mirror the aggregate current $i_{bleed}+i_{ref}$ as the current $i_{mirror}$. The current mirror 710 is shown as including two n-channel transistors $N_1$ and $N_2$, but other configurations may be applied. In the configuration illustrated in FIG. 7, the transistors $N_1$ and $N_2$ may have their source terminals coupled to the voltage supply $V_{SS}$. The comparator $A_1$ may have its output connected to the gate of the transistor $N_1$, its negative input connected to the drain of the transistor $N_1$, and its positive terminal connected to a voltage supply $V_{ref}$. The comparator $A_2$ may have its output connected to the gate of a third transistor $N_3$, its negative input connected to the source of the transistor $N_3$, and its positive terminal connected to the voltage supply $V_{ref}$. In the unlikely event when a negative current $i_{ref}$ may be greater in magnitude than the current $i_{bleed}$ (for example, due to an unexpected unknown capacitance $C_{unknown}$), a voltage at the drain terminals of the transistors $N_1$ and $N_2$ may exceed the voltage supply $V_{ref}$. In such a case, comparators $A_1$ and $A_2$ may disable transistors $N_1$ and $N_3$, respectively, effectively disabling the current mirror 710 without disrupting the operation the capacitive actuator 702.

In a simple implementation, the transistors $N_1$ and $N_2$ may be provided to have equal sizes and, therefore, the currents passed by the transistors $N_1$ and $N_2$ may be equal to each other ($i_{mirror}=i_{bleed}+i_{ref}$). If desired, however, the transistors $N_1$ and $N_2$ may be sized unequally, in which case the transistor $N_2$ will pass a current $i_{mirror}$ corresponding to the relative sizes of the two transistors $N_1$ and $N_2$ ($i_{mirror} \propto (i_{bleed}+i_{ref})$). For simplicity, the following analysis will assume equally-sized transistors $N_1$ and $N_2$. One skilled in the art would appreciate that the following analysis may be augmented with a scaling factor to account for the relative sizes of the two transistors $N_1$ and $N_2$.

Also in a simple configuration, the reference capacitor 709 and the measurement capacitor 711 may be sized such that the capacitances $C_{meas}$ and $C_{ref}$ are identical ($C_{meas}=C_{ref}$). However, if desired, the reference capacitor 709 and the measurement capacitor 711 may be unequally sized by a factor of φ and the capacitances $C_{meas}$ and $C_{ref}$ may be expressed as in equation (3) above.

As discussed, a voltage may develop across the measurement capacitor 711 as the current $i_{meas}$ passes through it. The current $i_{meas}$ may flow as long as either the switch $S_1$ or the switch $S_3$ is closed, causing the measurement voltage $V_{meas}$ to either decrease or increase, respectively. When either the switch $S_1$ or the switch $S_3$ is opened after a period of time t, the voltage across the measurement capacitor 711 may be expressed as:

$$V_{DD2} - V_{meas} = \frac{i_{meas}t}{C_{meas}} = \frac{i_{ref}t}{\varphi C_{ref}} \quad (18)$$

Substituting equation (17) into equation (18) results in:

$$V_{DD2} - V_{meas} = \frac{1}{\varphi(C_{ref} + C_{mems})} it \quad (19)$$

Therefore, a digital value generated by the ADC 712 may represent the variable capacitance $C_{mems}$ of the capacitive actuator 702 according to:

$$C_{mems} = \frac{1}{\varphi(V_{DD2} - V_{meas})} it - C_{ref} \quad (20)$$

Once the ADC 712 has generated a digital value, to allow for a subsequent capacitance measurement, the voltage across the measurement capacitor 711 may be reset to zero by closing a switch $S_2$ coupled across the measurement capacitor 711.

All the parameters and variables on the right hand side of equation (20) may be known, predetermined, and/or measured. A processor 706 may derive the capacitance $C_{mems}$ of the capacitive actuator 702, for example, by direct mathematical computation. Alternatively, the processor 706 may store a lookup table, indexed by digital values output by the ADC 712, that stores capacitance values of the capacitance $C_{mems}$. Similar to the system in FIG. 5, the processor 706 may further derive the actual position of the capacitive actuator 702 based on the derived capacitance $C_{mems}$ and may generate a position error signal when compared to a desired position of the capacitive actuator 702. A controller (not shown) in the processor 706 may then generate a command signal based on the position error signal, the derived capacitance $C_{mems}$ and a voltage measured by a voltage measurement circuit 705, and transmit it to the switch controller to control switches $S_1$ and $S_3$ accordingly to either charge or discharge the capacitive actuator 702, such that the position error signal may be driven to zero.

FIG. 8 illustrates a driver and voltage measurement circuit 800 for a capacitive actuator 802 having a variable capacitance $C_{mems}$ and connected to a device 820, according to an embodiment of the present invention. Similar to the circuit 700 of FIG. 7, the circuit 800 may allow current to be sourced to and sunk from the capacitive actuator 802, while allowing capacitance measurement in both situations. However, the circuit 800 does not require any bleeding current source. The circuit 800 may include a first current source 808, a second current sink 830, a reference capacitor 809, a first current mirror 810, a second current mirror 814, a source capacitor 811, a sink capacitor 813, and an ADC 812.

The circuit 800 may have an output terminal 803 that is coupled to a first terminal of the capacitive actuator 802. A second terminal of the capacitive actuator 802 may be coupled to a low voltage supply $V_{SS}$. An output of the ADC 812 may be output to an output terminal 807 of the circuit 800 and on to other systems such as a processor 806. The current source 808 may provide a current i to charge both the capacitive device 802 and the reference capacitor 809. The current sink 830 may provide a current i to discharge both the capacitive actuator 802 and the reference capacitor 809. As discussed below, the current source 808 and the current sink 830 may be used during both a driving interval and a capacitance measurement interval of the capacitive actuator 802. The reference capacitor 809, when coupled to the capacitive actuator 802 may form a current divider. Each branch of the current divider may receive a portion of the current i from either the current source 808 or the current sink 830 according to their relative capacitances. A current $i_{ref}$ thus may flow through the reference capacitor 809. Using the convention of the arrow shown in FIG. 8, the current $i_{ref}$ may be positive when the current source 808 is enabled and negative when the current sink 830 is enabled.

When the current source 808 is enabled (and the current sink 830 is disabled), the current mirror 810 may be employed by opening a switch $S_2$ and closing a switch $S_4$. The current mirror 810 may include a diode-connected transistor $N_1$ and a second transistor $N_2$ having its gate coupled to a gate of the first transistor $N_1$. Thus, during operation, the second transistor $N_2$ may pass a current $i_{source}$ in proportion to the current $i_{ref}$ that is passed by the first transistor $N_1$.

The source capacitor 811 may carry a voltage across it at a level that is determined by the current $i_{source}$. In the example illustrated in FIG. 8, the source capacitor 811 is illustrated as connected between the current mirror 810 and a voltage supply $V_{DD2}$. In this configuration, when the $i_{current}$ is passed by the current mirror 810 and with a switch $S_5$ closed and a switch $S_6$ opened, a measurement voltage $V_{meas}$ at a node established at a connection between the source capacitor 811 and the current mirror 810 may decrease. The ADC 812 may digitize the measurement voltage $V_{meas}$.

When the current sink 830 is enabled (and the current source 808 is disabled), the current mirror 814 may be employed by closing the switch $S_2$ and opening the switch $S_4$. The current mirror 814 may include a diode-connected transistor $P_1$ and a second transistor $P_2$ having its gate coupled to a gate of the first transistor $P_1$. Thus, during operation, the second transistor $P_2$ may pass a current $i_{sink}$ in proportion to the current $i_{ref}$ that is passed by the first transistor $P_1$.

The sink capacitor 813 may carry a voltage across it at a level that is determined by the current %$_{sink}$. In the example illustrated in FIG. 8, the sink capacitor 813 is illustrated as connected between the current mirror 814 and a voltage supply $V_{SS}$. In this configuration, when the current $i_{sink}$ is passed by the current mirror 814 and with the switch $S_6$ closed and the switch $S_5$ opened, a measurement voltage $V_{meas}$ at a node established at a connection between the sink capacitor 813 and the current mirror 814 may increase. Once again, the ADC 812 may digitize the measurement voltage $V_{meas}$.

In the configuration illustrated in FIG. 8, the current source 808 may be coupled to the voltage supply $V_{DD1}$ via a switch $S_1$. The switch $S_1$ may be controlled by a switch controller (not shown) to provide selective control to enable or disable the current source 808. When the switch $S_1$ is controlled to be closed, the current source 808 may provide a charging current to the capacitive actuator 802 and to the reference capacitor 809. The current source 808 may provide the charging current at a fixed magnitude (when switch $S_1$ is closed). A period of time t during which the switch $S_1$ remains closed may thus determine the amount of charge provided by the current source 808.

The current sink 830 may be coupled to the voltage supply $V_{SS}$ via a switch $S_3$. The switch $S_3$ may be controlled by the switch controller to provide selective control to enable or disable the current sink 830. When the switch $S_3$ is controlled to be closed, the current sink 830 may provide a discharging current to the capacitive actuator 802 and to the reference capacitor 809. The current sink 830 may provide the discharging current at a fixed magnitude (when switch $S_3$ is closed). A period of time t during which the switch $S_3$ remains closed may thus determine the amount of charge removed by the current sink 830. It should be noted that only one between switches $S_1$ and $S_3$ may be closed at a time. In other words, the current sources 808 and 830 may not be enabled at the same time.

The reference capacitor 809 having a capacitance $C_{ref}$ may be coupled in a circuit path from the output terminal 803 through the current mirrors 810 and 814. As discussed, the capacitor 809 and the capacitive actuator 802 form a current divider, dividing the current i from either the current source 808 or the current sink 830. As such, the current $i_{ref}$ flowing through the reference capacitor 809 is a portion of the current i from either the current source 808 or the current sink 830, dictated by the capacitances $C_{ref}$ and $C_{mems}$ as represented by equation (17) above.

As discussed, when the current source 808 is enabled (switch $S_1$ closed), the current mirror 810 may mirror as the current $i_{ref}$ to the source capacitor 811 as the current $i_{source}$. The current mirror 810 is shown as including two n-channel transistors $N_1$ and $N_2$, but other configurations may be applied. In the configuration illustrated in FIG. 8, the transistors $N_1$ and $N_2$ may have their source terminals coupled to a voltage supply $V_{ref}$, but again configurations may vary.

In a simple implementation, the transistors $N_1$ and $N_2$ may be provided to have equal sizes and, therefore, the currents passed by the transistors $N_1$ and $N_2$ may be equal to each other ($i_{source}=i_{ref}$). If desired, however, the transistors $N_1$ and $N_2$ may be sized unequally, in which case the transistor $N_2$ will pass a current $i_{source}$ corresponding to the relative sizes of the two transistors $N_1$ and $N_2$ ($i_{source} \propto i_{ref}$). For example, the current $i_{source}$ may be a factor $\alpha_{source}$ of the current $i_{ref}$ as:

$$i_{source} = \alpha_{source} i_{ref} \tag{21}$$

Also in a simple configuration, the reference capacitor 809 and the source capacitor 811 may be sized such that the capacitances $C_{source}$ and $C_{ref}$ are identical ($C_{source}=C_{ref}$). However, if desired, the reference capacitor 809 and the source capacitor 811 may be unequally sized by a factor of $\varphi_{source}$ and the capacitances $C_{source}$ and $C_{ref}$ may be expressed as:

$$C_{source} = \varphi_{source} C_{ref} \tag{22}$$

As discussed, a voltage may develop across the source capacitor 811 as the current $i_{source}$ passes through it. The current $i_{source}$ may flow as long as either the switch $S_1$ is closed, causing the measurement voltage $V_{meas}$ (switch $S_5$ closed) to decrease. When the switch $S_1$ is opened after a period of time t, the voltage across the source capacitor 811 may be expressed as:

$$V_{DD2} - V_{meas} = \frac{i_{source} t}{C_{source}} \tag{23}$$

Substituting equations (17), (21), and (22) into equation (23) results in:

$$V_{DD2} - V_{meas} = \frac{\alpha_{source}}{\varphi_{source}(C_{ref} + C_{mems})} it \tag{24}$$

Therefore, a digital value generated by the ADC 812 may represent the variable capacitance $C_{mems}$ of the capacitive actuator 802, after being charged, according to:

$$C_{mems} = \frac{\alpha_{source}}{\varphi_{source}(V_{DD2} - V_{meas})} it - C_{ref} \tag{25}$$

Once the ADC 812 has generated a digital value, to allow for a subsequent capacitance measurement, the voltage across the source capacitor 811 may be reset to zero by closing a switch $S_2$ coupled across the measurement capacitor 811.

As discussed, when the current sink 830 is enabled (switch $S_3$ closed), the current mirror 814 may mirror as the current $i_{ref}$ to the sink capacitor 813 as the current $i_{sink}$. The current mirror 814 is shown as including two p-channel transistors $P_1$ and $P_2$, but other configurations may be applied. In the configuration illustrated in FIG. 8, both transistors $P_1$ and $P_2$ may have their source terminals coupled to the voltage supply $V_{ref}$.

In a simple implementation, the transistors $P_1$ and $P_2$ may be provided to have equal sizes and, therefore, the currents passed by the transistors $P_1$ and $P_2$ may be equal to each other ($i_{sink}=i_{ref}$). If desired, however, the transistors $P_1$ and $P_2$ may be sized unequally, in which case the transistor $P_2$ will pass a current $i_{sink}$ corresponding to the relative sizes of the two transistors $P_1$ and $P_2$ ($i_{sink} \propto i_{ref}$). For example, the current $i_{sink}$ may be a factor $\alpha_{sink}$ of the current $i_{ref}$ as:

$$i_{sink} = \alpha_{sink} i_{ref} \tag{26}$$

Also in a simple configuration, the reference capacitor 809 and the sink capacitor 813 may be sized such that the capacitances $C_{sink}$ and $C_{ref}$ are identical ($C_{sink}=C_{ref}$). However, if desired, the reference capacitor 809 and the sink capacitor 813 may be unequally sized by a factor of $\varphi_{sink}$ and the capacitances $C_{sink}$ and $C_{ref}$ may be expressed as:

$$C_{sink} = \varphi_{sink} C_{ref} \tag{27}$$

As discussed, a voltage may develop across the sink capacitor 813 as the current $i_{sink}$ passes through it. The current $i_{sink}$ may flow as long as either the switch $S_3$ is closed, causing the measurement voltage $V_{meas}$ (switch $S_6$ closed) to increase. When the switch $S_3$ is opened after a period of time t, the voltage across the sink capacitor 813 may be expressed as:

$$V_{meas} - V_{SS} = \frac{i_{sink} t}{C_{sink}} \tag{28}$$

Substituting equations (17), (26), and (27) into equation (28) results in:

$$V_{meas} - V_{SS} = \frac{\alpha_{sink}}{\varphi_{sink}(C_{ref} + C_{mems})} it \tag{29}$$

Therefore, a digital value generated by the ADC 812 may represent the variable capacitance $C_{mems}$ of the capacitive actuator 802, after being discharged, according to:

$$C_{mems} = \frac{\alpha_{sink}}{\varphi_{sink}(V_{meas} - V_{SS})} it - C_{ref} \qquad (30)$$

Once the ADC 812 has generated a digital value, to allow for a subsequent capacitance measurement, the voltage across the sink capacitor 813 may be reset to zero by closing a switch $S_4$ coupled across the measurement capacitor 813.

All the parameters and variables on the right hand side of equations (25) and (30) may be known, predetermined, and/or measured. A processor 806 may derive the capacitance $C_{mems}$ of the capacitive actuator 802, for example, by direct mathematical computation. Alternatively, the processor 806 may store a lookup table, indexed by digital values output by the ADC 812, that stores capacitance values of the capacitance $C_{mems}$. Similar to the system in FIG. 5, the processor 806 may further derive the actual position of the capacitive actuator 802 based on the derived capacitance $C_{mems}$ and may generate a position error signal when compared to a desired position of the capacitive actuator 802. A controller (not shown) in the processor 806 may then generate a command signal based on the position error signal, the derived capacitance $C_{mems}$ and a voltage measured by a voltage measurement circuit 805, and transmit it to the switch controller to control switches $S_1$ and $S_3$ accordingly to either charge or discharge the capacitive actuator 802, such that the position error signal may be driven to zero.

FIG. 9 illustrates a voltage measurement circuit 905 to measure the voltage across a capacitive actuator 902 connected to a device 920, according to an embodiment of the present invention. The circuit 905 may be employed in the configurations of FIGS. 7 and 8 for the voltage measurement circuits 705 and 805, respectively. The circuit 905 may include a current source 962, a transistor network 963, a voltage divider 964, and an ADC 965.

The current source 962 may source a current i to the transistor network 963. The transistor network 963 may mirror a voltage $V_{mems}$ at the output terminal 966 to the voltage divider 964. The voltage divider 964 may scale the voltage $V_{mems}$ down to a voltage $V_{out}$ and provide it to the ADC 965. The ADC 965 may digitize the voltage $V_{out}$ and output it to a processor 906 via an output terminal 967 of the circuit 905.

In the configuration illustrated in FIG. 9, the current source 962 may be coupled a voltage supply $V_{DD1}$ and may source a current i of predetermined magnitude (for example, 0.5 μA) to the transistor network 963.

The transistor network 963 may include transistors $P_1$, $N_1$, and $N_2$. The transistor $P_1$ may have its gate coupled to the output terminal 966, its drain to a low voltage supply $V_{SS}$, and its source to the current source 962 and the gate of transistor $N_1$. The transistor $N_1$ may have its drain connected to the voltage supply $V_{DD1}$ and its source to the drain of the transistor $N_2$ via a resistor $R_1$ of the voltage divider 964. The transistor $N_2$ may have its gate connected to a voltage supply $V_{DD2}$ and its source coupled to the resistor $R_4$ voltage divider 964. In certain configurations, a resistor $R_2$ may be included in path between the transistor $N_2$ and the voltage supply $V_{DD2}$. In such a configuration, the transistor network 963, when biased, may mirror the voltage $V_{mems}$ to the voltage divider 964.

The voltage divider 964 may include the resistor $R_1$ and a resistor $R_4$ in series (when the transistor $N_2$ is on). The voltage divider 964 may scale the voltage $V_{mems}$ down to a voltage $V_{out}$ according to a ratio of the resistors $R_1$ and $R_4$. The ADC 965 may digitize the voltage $V_{out}$ and output the digitized voltage to the output terminal 967. In practice, the values of the resistors $R_1$ and $R_4$ may be known. Therefore, a processor 906 may derive the voltage $V_{mems}$ from the digitized voltage $V_{out}$. In certain configurations, a resistor $R_3$ may be provided in the path between the transistor $N_2$ and the resistor $R_4$, effectively adding to the resistance of the resistor $R_1$ in the scaling ratio.

Figure 10:
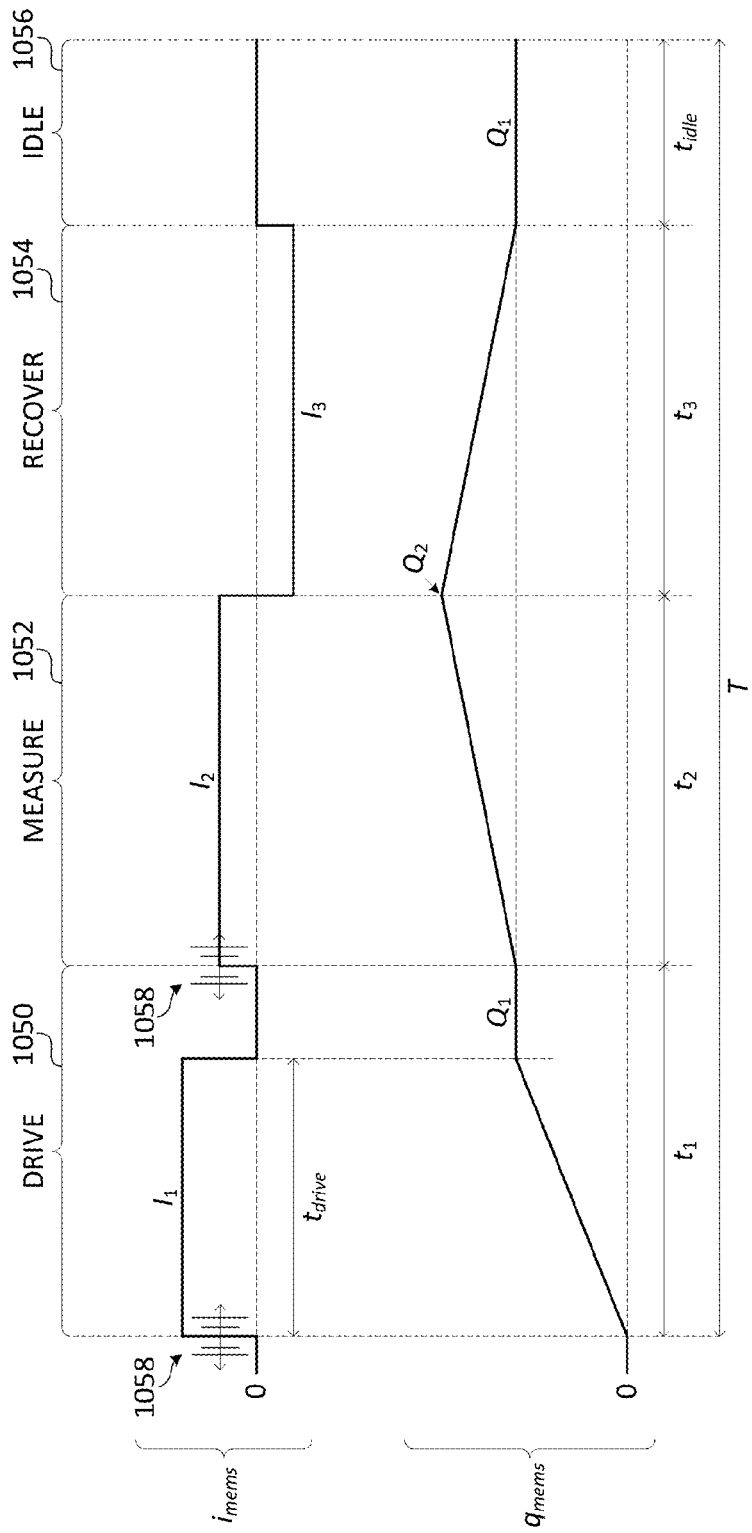
FIG. 10 illustrates exemplary timing diagrams according to an embodiment of the present invention.
Figure 11:
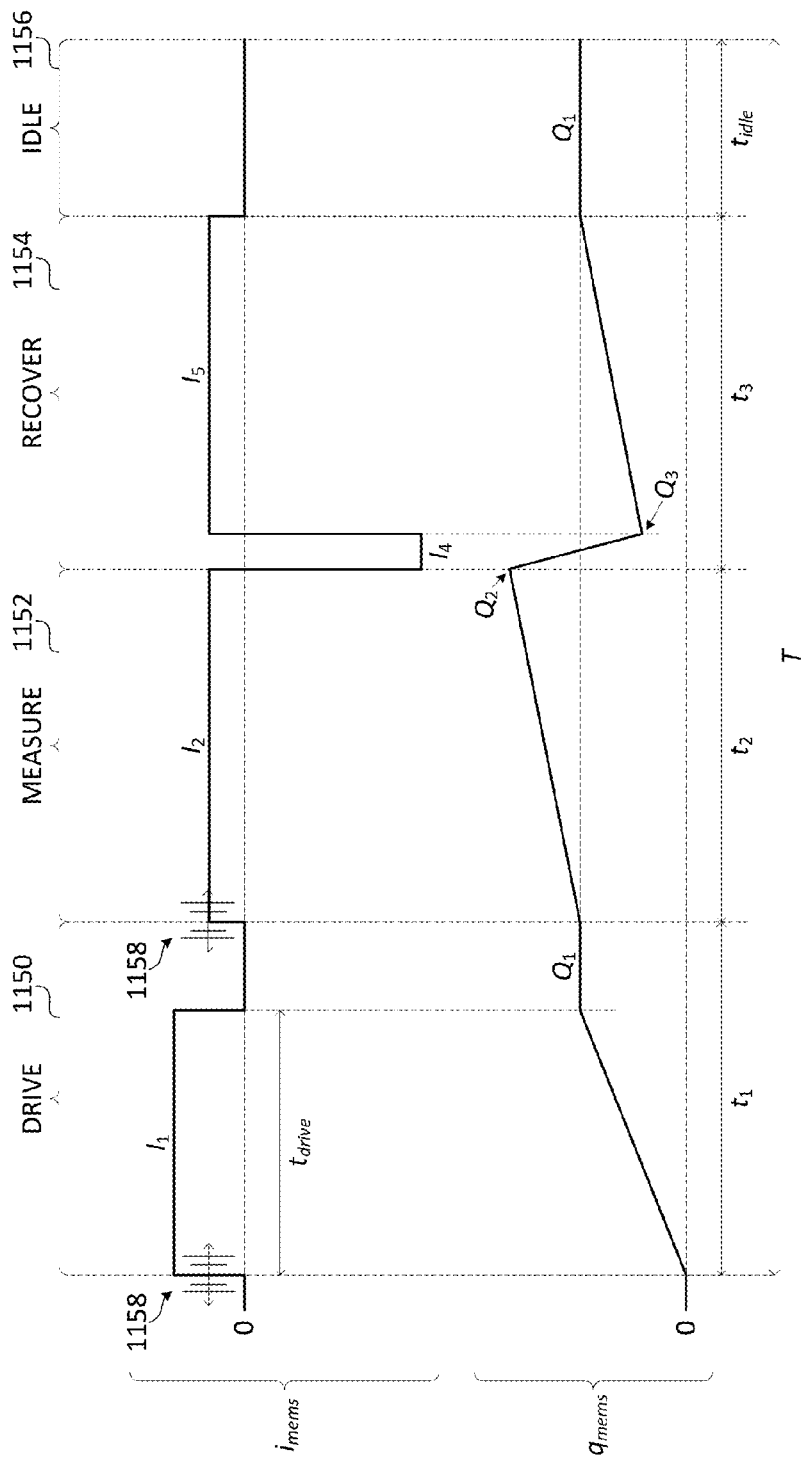
FIG. 11 illustrates exemplary timing diagrams according to an embodiment of the present invention.
Figure 12:
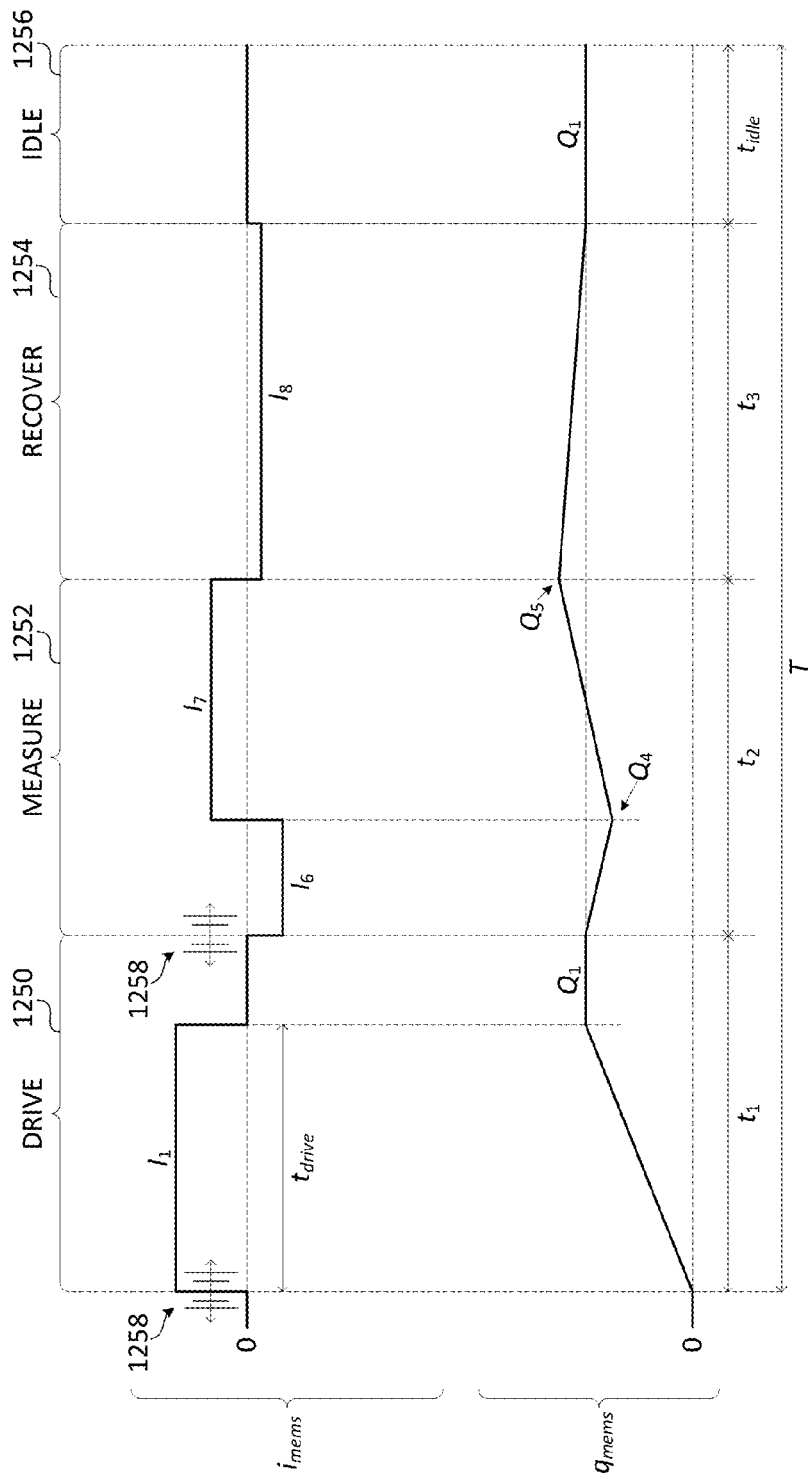
FIG. 12 illustrates exemplary timing diagrams according to an embodiment of the present invention.

FIGS. 10-12 illustrate timing diagrams that may relate to how either the circuit 700 of FIG. 7 or the circuit 800 of FIG. 8 may be operated. The timing diagrams in FIGS. 10-12 illustrate one cycle, out of a plurality of repeating cycles, of a current $i_{mems}$ flowing through and a charge $q_{mems}$ stored in a capacitive actuator such as the ones shown in FIGS. 7 and 8. As will be discussed, the current $i_{mems}$ may include both a drive current and a test current.

In FIG. 10, the one cycle may include a drive interval 1050, a measure interval 1052, a recover interval 1054, and an idle interval 1056. During the drive interval 1050, the actuator may be driven to a desired position. During the measure interval 1052, a test current may either be sourced to or sunk from the actuator to induce a relatively small change in charge stored in the actuator, allowing for a voltage measurement representative of the capacitance of the actuator. During the recover interval 1054, the test current may be prolonged to bring the charge of the actuator back to a level just prior to a start of the measure interval 1052. The actuator may be considered to be under a test mode during the measure interval 1052 and the recover interval 1054. No current may be driven into or out of the actuator during the idle interval 1056. The idle interval 1056 may allow for processing and computation between cycles.

In FIG. 10, the one cycle is illustrated as lasting for a period T. The drive interval 1050 may last for a period $t_1$, the measure interval 1052 for a period $t_2$, the recover interval 1054 for a period $t_3$, and the idle interval for a period of $t_{idle}$. The periods $t_1$, $t_2$, and $t_3$ are not limited to be of equal duration and may be varied. The period T may be chosen based on a mechanical frequency response of the actuator. For example, the period T may be chosen such that a frequency of the repeating cycles corresponds to a minimal mechanical disturbance in the displacement of the actuator. In one embodiment of the present invention, the period T may be fixed at 300 microseconds. It should be noted that the period $t_{idle}$ may be split to provide idle times before any of the drive, measure, and recover intervals. Also, the drive interval may be carried out after the measure and recover intervals.

For illustration, in FIG. 10, prior to operation of the actuator, the current $i_{mems}$ and the charge $q_{mems}$ are assumed to be zero. During the drive interval 1050, a drive current having a magnitude $I_1$ may be driven into the actuator for a time period $t_{drive}$ to change the position of the actuator. For example, such a drive current may be supplied by enabling the current sources 708 and 808 in the circuits 700 and 800, respectively. Conversely, a drive current of negative magnitude may be sunk from the actuator to change its position in an opposite direction. In such a case, for example, the current sinks 730 and 830 may be enabled in the circuits 700 and 800, respectively.

In an embodiment of the present invention, the magnitude $I_1$ may be kept constant and the time period $t_{drive}$ may be varied to vary the amount of the charge supplied to the capacitive actuator, for example, by controlling the period of time during which the switch $S_3$ is kept closed. Alternatively, the time period $t_{drive}$ may be kept constant and the magnitude $I_1$ may be varied to vary the amount of the charge supplied to the capacitive actuator. As the drive current with a magnitude $I_1$ is driven into the actuator, the charge $q_{mems}$ may increase and the position of the actuator may be changed. The charge $q_{mems}$ may reach a charge $Q_1$ at the end of the time period $t_{drive}$. At this point, the actuator may have reached a position that may not necessarily be a desired position.

As discussed, the actual position of the actuator may be derived from a capacitance of the actuator. The capacitance in turn may be derived by driving a test current into the actuator and measuring a voltage representative of the capacitance (for example, $V_{meas}$). Therefore, in the example illustrated in FIG. 10, over the duration of the measure interval 1052, a test current having a magnitude $I_2$ may be driven into the actuator. The magnitude $I_2$ is desirably relatively smaller than the magnitude $I_1$ of the drive current in order to minimize disturbance to a device connected to the actuator. For example, the test current may also be provided by enabling the current sources 708 and 808 in the circuits 700 and 800, respectively. At the end of the measure interval 1052, the charge $q_{mems}$ may have reached a charge $Q_2$. The voltage ($V_{meas}$) may be measured at the end of the measure interval 1052. Alternatively, the voltage may be measured at any predetermined point during the measure interval 1052.

Once the measurement is made, it is desirable to bring the charge of the actuator back to the charge $Q_1$. This may be achieved by sinking a negative test current having a magnitude $I_3$ from the actuator (by enabling the current sinks 730 and 830, for example) during the recover interval 1054. In this example, if the periods $t_2$ and $t_3$ are equal, the magnitudes $I_2$ and $I_3$ may also be equal. During the recover interval, a processor may derive based on the measured voltage the capacitance, and subsequently the actual position, of the actuator. A controller of the processor may further generate a command signal to drive the actuator in the next cycle. For example, the command signal may be a value for the time period $t_{drive}$. The process of driving, measuring, and recovering may be repeated as needed such that the actuator may be driven to the desired position.

In certain embodiments of the present invention, the period T may translate into a frequency that may be within the audible frequency range. As such, the actuator may generate audible noise when being driven at such a frequency. To prevent such audible noise, a dither 1058 may be included in at least one of a start and an end of the drive interval 1052, as illustrated in FIG. 10. The dither 1058 may shift the periods $t_2$ and $t_3$ left or right, without changing their durations. In certain embodiments, the period $t_{idle}$ is allowed to change to account for changes made by the dither 1058 to the period $t_1$, such that the period T of one cycle remains fixed from cycle to cycle. The dither 1058 may ensure that the current $i_{mems}$ is different from cycle to cycle, thus preventing any audible noise.

FIG. 11 illustrates another exemplary cycle of a current $i_{mems}$ and a charge $q_{mems}$. The drive interval 1150 and the measure interval 1152 are similar to those of FIG. 10. Therefore, their descriptions will be omitted. During the recover interval 1154, a test current of dual polarity in magnitude may be employed. The test current may start negative with a magnitude $I_4$ driving the charge $q_{mems}$ from a charge $Q_2$ to a charge $Q_3$, and then may change to positive with a magnitude $I_5$ driving the charge $q_{mems}$ back to the charge $Q_1$. The measure interval 1152 may also include a dither 1158 to prevent audible noise.

FIG. 12 illustrates another exemplary cycle of a current $i_{mems}$ and a charge $q_{mems}$. The drive interval 1250 is similar to those of FIG. 10. Therefore, its description will be omitted. During the measure interval 1252, a test current of dual polarity in magnitude may be employed. The test current may start negative with a magnitude $I_6$ driving the charge $q_{mems}$ from a charge $Q_1$ to a charge $Q_3$, and then may change to positive with a magnitude $I_7$ driving the charge $q_{mems}$ to a charge a. During the recover interval, a negative test current having a magnitude $I_8$ may be used to drive the charge $q_{mems}$ to back to the charge $Q_1$. The measure interval 1252 may also include a dither 1258 to prevent audible noise.

Figure 13:
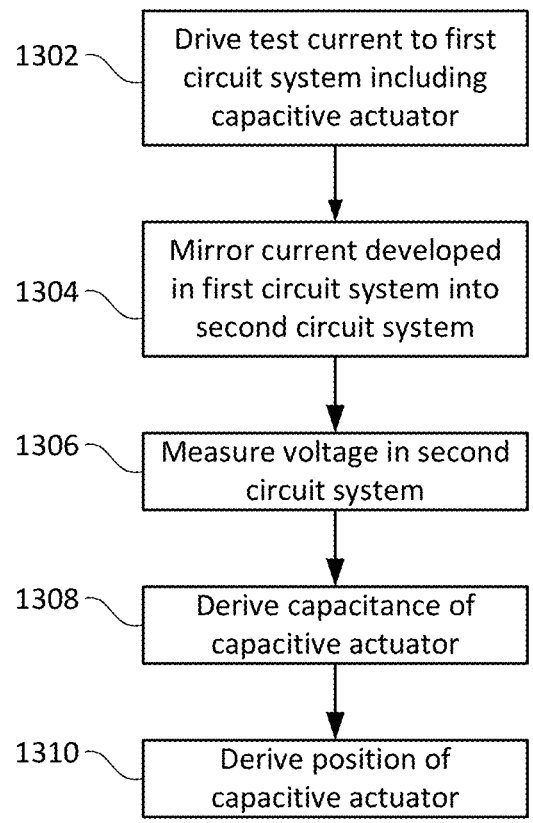
FIG. 13 is a flowchart depicting a method of deriving a position of a capacitive device according to an embodiment of the present invention.

FIG. 13 is a flowchart depicting a method 1300 of deriving a position of a capacitive device according to an embodiment of the present invention. The discussion of FIG. 13 will make references to the embodiment illustrated in FIG. 7, but it should be understood that the method 1300 is not limited to the specific embodiment of FIG. 7, but is more generally applicable. For example, the method 1300 also applies to FIGS. 1-4, and 8.

The method 1300 begins at step 1302 by driving a test current to a first circuit system that includes a capacitive actuator (for example, the capacitive actuator 702) and a reference capacitor (for example, the reference capacitor 709). At step 1304, the method 300 mirrors (for example, using the current mirror 710) a current developed in the reference capacitor to a second circuit system that includes a measurement capacitor (for example, the measurement capacitor 711). At step 1306, the method 300 measures a voltage (for example, the measurement voltage $V_{meas}$) within the second circuit system. At step 1308, the method derives a capacitance of the capacitive actuator based on the measured voltage with reference to capacitances of the reference capacitor and the measurement capacitor. As discussed, the capacitance may be either mathematically computed or looked up from a lookup table, indexed by values of the measure voltage, that stores capacitance values of the actuator. At step 1310, the method further derives a position of the actuator based on the derived capacitance of the actuator. As discussed, for example, the position of the actuator may be looked up from a lookup table, indexed by capacitance values, that stores position values of the actuator.

It should be understood that there exist implementations of other variations and modifications of the invention and its various aspects, as may be readily apparent to those of ordinary skill in the art, and that the invention is not limited by specific embodiments described herein. Features and embodiments described above may be combined with and without each other. It is therefore contemplated to cover any and all modifications, variations, combinations or equivalents that fall within the scope of the basic underlying principles disclosed and claimed herein.

What is claimed is:

1. A method for measuring a capacitance of a capacitive device, comprising:
    applying a first current to a first circuit system comprising a current divider formed by the capacitive device and a reference capacitor;
    mirroring a second current developed in the reference capacitor to a second circuit system that includes a measurement impedance;
    measuring a voltage generated across the measurement impedance; and deriving the capacitance of the capacitive device unknown capacitance based on the measured voltage and capacitance value of the reference capacitor and an impedance value of the measurement impedance.

2. The method of claim 1, further comprising digitizing the measured voltage.

3. The method of claim 1, further comprising:
applying a fourth current to the reference capacitor such that a difference between the fourth current and the second current is positive for predetermined capacitance values of the capacitive device.

4. The method of claim 1, wherein the capacitive device is a capacitive actuator, and the method further comprises estimating a position of the capacitive actuator from the derived capacitance of the capacitive device.

5. The method of claim 1, wherein the capacitive device is a capacitive actuator, and the method further comprises correcting a drive signal of the capacitive actuator based on the derived capacitance of the capacitive device.

6. The method of claim 1, wherein the capacitive device is a capacitive actuator, and the method further comprises:
driving the capacitive actuator in a driving phase with a drive signal according to a desired position of the capacitive actuator, and measuring during a measurement phase the capacitance of the capacitive actuator; and
correcting the drive signal of the capacitive actuator for a subsequent iteration of the driving and measurement phase based on the derived capacitance of the capacitive device.

7. An integrated circuit for measuring a capacitance of a capacitive device, comprising:
a first current source coupled to an output terminal configured for connection to the capacitive device and supplying a first current;
a current mirror having first and second current paths;
a reference capacitor coupled to the output terminal and the first current path;
a measurement impedance coupled to the second current path; and
an analog-to-digital converter having an input coupled to a second node within the second current path and configured to measure a voltage at the second node.

8. The integrated circuit of claim 7, further comprising a second current source coupled to a first node between the reference capacitor and the first current path, wherein the second current source is sized to supply a second current that exceeds the first current from the first current source for predetermined capacitance values of the capacitive device.

9. The integrated circuit of claim 7, wherein transistors of the current mirror have equal sizes.

10. The integrated circuit of claim 7, wherein transistors of the current mirror have non-equal sizes.

11. The integrated circuit of claim 7, wherein the capacitive device is a capacitive actuator, the integrated circuit further comprising a controller to drive the first current source iteratively among a drive mode and a measurement mode, wherein:
during the drive mode, the controller drives the first current at a setting determined by a position signal representing a position of the capacitive actuator, and during the measurement mode, the controller generates a correction signal for a next iteration based on a value output by the analog-to-digital converter commensurate with the voltage measured at the second node.

12. The integrated circuit of claim 11, wherein, in the drive mode, the controller varies a duration of activation of the first current source.

13. The integrated circuit of claim 11, wherein the controller dithers onsets of signals output from the first current source from iteration to iteration.

14. A driver and voltage measurement circuit for operating a capacitive actuator, comprising:
a driver providing a drive signal to the capacitive actuator for changing a position of the capacitive actuator; and
a first voltage measurement circuit measuring a voltage representative of a capacitance of the capacitive actuator, the voltage measurement circuit comprising: a first current source coupled to the capacitive actuator and supplying a first current;
a current mirror having first and second current paths;
a reference capacitor coupled to a connection point between the capacitive actuator and the first current path; and
a measurement impedance coupled to the second current path;
wherein the voltage representative of the capacitance of the capacitive actuator is supplied at a second node within the second current path; and
a controller supplying control signals to the driver based on an error signal representing a difference between an actual position of the capacitive actuator derived from the capacitance of the capacitive actuator as determined by the first voltage measurement circuit and a position setting for the capacitive actuator.

15. The driver and voltage measurement circuit of claim 14, further comprising an analog-to-digital converter for digitizing the voltage measured at the second node and supplying the digitized voltage to the controller.

16. The driver and voltage measurement circuit of claim 14, further comprising a second current sink configured to discharge both the capacitive actuator and the reference capacitor, wherein the first current source and second current sink are prevented from being enabled at the same time.

17. The driver and voltage measurement circuit of claim 14, further comprising a second measurement circuit to directly measure a voltage of the capacitive actuator.

18. The driver and voltage measurement circuit of claim 17, further comprising storage for lookup tables correlating values of the actual position and the directly measured voltage to drive current settings.

19. The driver and voltage measurement circuit of claim 18, wherein the storage includes sub-tables indexed by values representing gravitational forces acting on the capacitive actuator.

20. The driver and voltage measurement circuit of claim 14, wherein the controller derives drive current settings based at least in part on values representing gravitational forces acting on the capacitive actuator.

* * * * *